(12) United States Patent
Kandanarachchi et al.

(10) Patent No.: US 8,663,904 B2
(45) Date of Patent: Mar. 4, 2014

(54) NORBORNENE-TYPE POLYMERS, COMPOSITIONS THEREOF AND LITHOGRAPHIC PROCESS USING SUCH COMPOSITIONS

(71) Applicant: Promerus, LLC, Brecksville, OH (US)

(72) Inventors: Pramod Kandanarachchi, Brecksville, OH (US); Kazuyoshi Fujita, Tokyo (JP); Steven Smith, Broadview Heights, OH (US); Larry F Rhodes, Silver Lake, OH (US)

(73) Assignee: Promerus, LLC, Brecksville, OH (US)

( * ) Notice: Subject to any disclaimer, the term of this patent is extended or adjusted under 35 U.S.C. 154(b) by 0 days.

(21) Appl. No.: 13/961,121

(22) Filed: Aug. 7, 2013

(65) Prior Publication Data

US 2013/0323644 A1   Dec. 5, 2013

Related U.S. Application Data

(62) Division of application No. 13/079,240, filed on Apr. 4, 2011, now Pat. No. 8,541,523.

(60) Provisional application No. 61/341,810, filed on Apr. 5, 2010.

(51) Int. Cl.
*G03F 7/00* (2006.01)
*G03F 7/32* (2006.01)
*G03F 7/40* (2006.01)
*G03F 7/11* (2006.01)

(52) U.S. Cl.
USPC ............... 430/273.1; 430/270.1; 430/331; 430/322; 430/435; 430/330

(58) Field of Classification Search
USPC ........... 430/270.1, 273.1, 311, 322, 329, 330, 430/331, 435
See application file for complete search history.

(56) References Cited

U.S. PATENT DOCUMENTS 6,858,379 B2 *   2/2005   Zampini et al. ............... 430/325
7,629,423 B2 *   12/2009  Jung et al. ..................... 526/100

FOREIGN PATENT DOCUMENTS

JP       2006028525 A  *  2/2006

* cited by examiner

*Primary Examiner* — Amanda C. Walke
(74) *Attorney, Agent, or Firm* — Balaram Gupta

(57) ABSTRACT

Embodiments in accordance with the present invention provide for non-self imageable norbornene-type polymers useful for immersion lithographic processes, methods of making such polymers, compositions employing such polymers and immersion lithographic processes that make use of such compositions. More specifically the embodiments of the present invention are related to norbornene-type polymers useful for forming top-coat layers for overlying photoresist layers in immersion lithographic process and the process thereof.

20 Claims, 2 Drawing Sheets

Non-retained Immersion Fluid

NORBORNENE-TYPE POLYMERS, COMPOSITIONS THEREOF AND LITHOGRAPHIC PROCESS USING SUCH COMPOSITIONS

CROSS REFERENCE TO RELATED APPLICATIONS

This application is a divisional of U.S. application Ser. No. 13/079,240, filed Apr. 4, 2011, now allowed, which claims the benefit of U.S. Provisional Application No. 61/341,810, filed Apr. 5, 2010, both of which are incorporated herein by reference in their entirety.

TECHNICAL FIELD

Embodiments in accordance with the present invention relate generally to norbornene-type polymers, methods of making such polymers, compositions employing such polymers and lithographic processes that make use of such compositions. More specifically such embodiments relate to norbornene-type polymers, compositions thereof and lithographic methods using such polymer compositions that are useful for immersion lithographic processes as protective layers.

BACKGROUND

In the past, methods for achieving smaller feature sizes have been to select a lithographic radiation source having a shorter wavelength, increase the numerical aperture (NA) of the lithographic system's lens or a combination thereof. While these methods have met with success, for each reduction in wavelength and/or increase in NA, the problems associated with taking advantage of such changes have been increasingly difficult to overcome.

Recently it has been suggested that rather than selecting a new lithographic radiation source with a shorter wavelength, e.g. 157 nm, the resolution of the current 193 nm standard source could be extended by the use of an immersion lithographic process. Such immersion lithographic processes replace the usual "air gap" between a lithographic tool's final lens and the substrate being exposed with a liquid, for example, water. The water, having a refractive index that is much greater than that of air, allows for the use of higher numerical aperture (NA) lens than would otherwise be possible while maintaining and acceptable depth of focus (DOF). Thus, it is believed that minimum feature sizes of 45 nm or less can be achieved with such an approach.

However, the successful implementation of immersion lithography for microelectronic device fabrication presents new problems that need to be resolved. For example, typically the substrate being exposed during a microlithographic process is repeatedly repositioned with respect to the lithographic tools lens at a high speed to achieve complete exposure of all portions of the substrate in a timely manner. With the addition of the aforementioned liquid (also referred to herein as an "immersion fluid", "immersion medium", or "IM") residues of such a fluid that result from the repositioning have been observed and are the likely cause of imaging defects. While such repositioning related defects might be reduced or even eliminated by reducing the speed of the repositioning, such a decrease in movement speed (scanability) would result in an unacceptable decrease in the number of substrates per hour that a lithographic tool can fully expose.

In addition to problems relating to IM residuals and scanability, the use of an IM also raises concerns with regard to problems that can result from such a fluid being in direct contact with the imaging or photoresist layer that can lead to a reduction in that layer's ability to provide the desired image. For example, such problems can include, among others: 1) leaching of small molecules such as photoacid generators (PAGs) and PAG photoproducts from the photoresist film into the IM and 2) absorption of the immersion medium, or components thereof, into the photoresist film.

One method that has been investigated for the elimination or reduction of these and other problems associated with immersion lithography is the use of an intervening layer disposed overlying the photoresist film for receiving the IM. Such an intervening layer also referred to as a "top-coat" or "protecting layer," can thus prevent or greatly reduce any imaging problems that might result from the leaching of small molecules from the photoresist layer or the absorption of the IM into such layer. With regard to scanability, the use of a top-coat allows for the design of such a material to have the specific properties necessary to eliminate or greatly reduce the possibility of IM residuals with little or no reduction in the speed of a tool's speed of movement.

The material used for such a "top-coat" or "protecting layer" should serve to protect the photoresist layer from the immersion fluid during the immersion photolithographic process. Such material should also be readily removable before or during the development of an image on the underlying photoresist layer.

BRIEF DESCRIPTION OF THE DRAWINGS

Embodiments in accordance with the invention are described below with reference to the following accompanying drawings.

DETAILED DESCRIPTION

Figure 1:
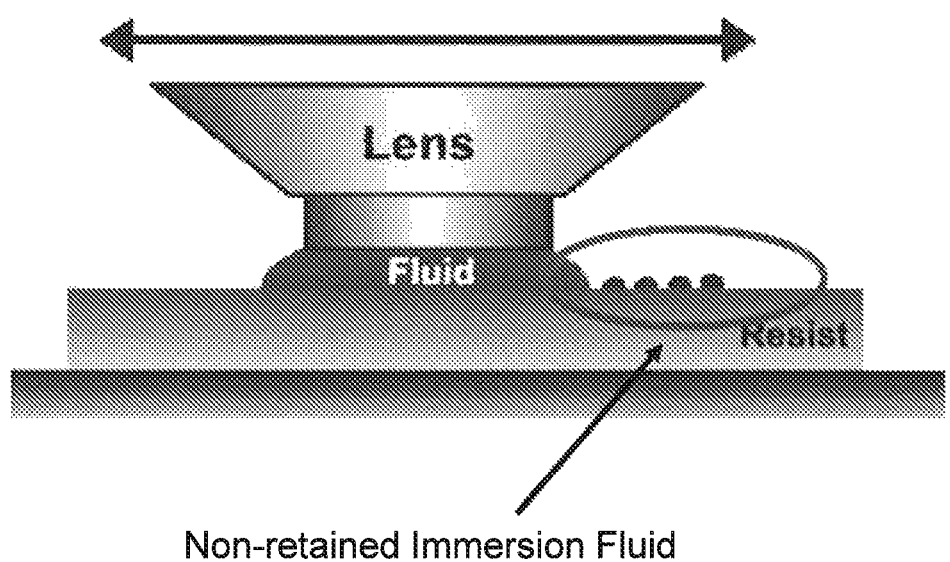
FIG. 1 is a representation of an immersion lithographic system depicting a lens element, having movement in the direction of the arrow, a resist layer and both a fluid (immersion medium) between the resist layer and the lens element as well as non-retained immersion fluid overlying portions of the resist layer.

Exemplary embodiments of the present invention will be described with reference to the Examples, Claims and the aforementioned figures. Various modifications, adaptations or variations of such exemplary embodiments may become apparent to those skilled in the art as such are disclosed. It will be understood that all such modifications, adaptations or variations that rely upon the teachings of the present invention, and through which these teachings have advanced the art, are considered to be within the scope of the present invention.

As used herein, the articles "a," "an," and "the" include plural referents unless otherwise expressly and unequivocally limited to one referent.

As used herein, the terms "group" or "groups" when used in relation to a chemical compound and/or representative chemical structure/formula, mean an arrangement of one or more atoms.

As used herein, molecular weight values of polymers, such as weight average molecular weights (Mw) and number average molecular weights (Mn), are determined by gel permeation chromatography using polystyrene standards.

As used herein, polydispersity index (PDI) values represent a ratio of the weight average molecular weight ($M_w$) to the number average molecular weight ($M_n$) of the polymer (i.e., $M_w/M_n$).

Unless otherwise indicated, all numbers, values and/or expressions referring to quantities of ingredients, reaction conditions, etc., used herein, will be understood as being modified in all instances by the term "about." In addition, various numerical ranges and ratios are disclosed in this patent application. Where such are continuous, they include the minimum and maximum values of the range or ratio as well as every value between such minimum and maximum values; where the ranges or ratios refer to integers, such include the minimum and maximum values and every integer between such minimum and maximum values. Further, all ranges or ratios disclosed herein are to be understood to encompass any and all subranges or subratios subsumed therein. For example, a stated range or ratio of "1 to 10" should be considered to include any and all subranges between (and inclusive of) the minimum value of 1 and the maximum value of 10; that is, all subranges or subratios beginning with a minimum value of or more and ending with a maximum value of 10 or less, such as but not limited to, 1 to 6.1, 3.5 to 7.8, and 5.5 to 10. Unless expressly indicated otherwise, the various numerical ranges specified in this specification and in the claims are approximations that are reflective of the various uncertainties of measurement encountered in obtaining such values.

Furthermore, it will be understood that when embodiments or examples are described in the specification, such embodiments or examples are not intended to limit the present invention to being exclusively within the metes and bounds set out in the descriptions of such embodiments or examples. Rather, such descriptions will be understood as being provided for illustrative purposes.

Embodiments in accordance with the present invention encompass polymers that have repeating units (Formula I) are derived from norbornene-type monomers (Formula Ia), where n is an integer from 0 to 5, and each of $R^1$, $R^2$, $R^3$ and $R^4$ independently represents hydrogen, or a pendent group as will be defined below:

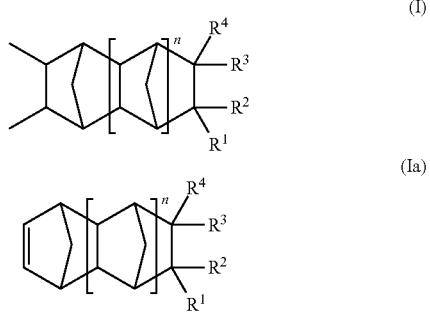

Polymers encompassing repeat units in accordance with Formula I are generally referred to as "norbornene-type" or "NB-type" polymers, where the abbreviation "NB" is used to refer to norbornene. Such synthesized polymers or resins are generally formed by vinyl-addition polymerization of one or more appropriate norbornene-type monomers such as are represented by structural Formula Ia above, and as further illustrated in the descriptions below.

The term "non-self imageable polymer" refers to a polymer or resin that, when formed into a film or layer having an essentially uniform thickness over a substrate, is not imageable by direct irradiation, for example irradiation by a 193 nanometer (nm) or 157 nm radiation source.

The terms "top-coat material" or "top-coat composition" are used interchangeably herein and refer to a material or composition that encompasses a non-self imageable polymer. Such a composition is useful for forming a film or layer over a photoresist layer to protect such photoresist layer during an immersion lithographic process. Such top-coat layer or film is therefore non-self imageable.

The terms "immersion material," "immersion medium," and "immersion fluid" are used interchangeably herein and refer to a liquid used to replace air in the exposure radiation pathway between a lens, used for focusing and directing the radiation, and a substrate having an imageable layer (a photoresist layer) disposed thereon as depicted in FIG. 1. The fluid has a refractive index greater than air and less than any layer disposed between a lithographic tool's lens and the upper surface of a substrate.

The terms "non-retained immersion material," "non-retained immersion medium," and "non-retained immersion fluid" are used interchangeably herein and refer to portions of immersion material that are separated from the immersion medium disposed between a lithographic tool's lens and the upper surface of a substrate. Such non-retained immersion fluid is depicted in FIG. 1. Further to this definition, the terms "Scanability" and "Scan Speed Durability" are also used interchangeably herein and refer to the relative speed at which the substrate moves with respect to the lens during the process of exposing portions of the substrate to image forming radiation. Where an immersion medium is present, scanability includes whether or not any non-retained immersion material is formed. By way of example, for an immersion lithographic process, the designation of high scanability means that little or no non-retained immersion material is observed to be formed at an acceptable relative speed.

Figure 2:
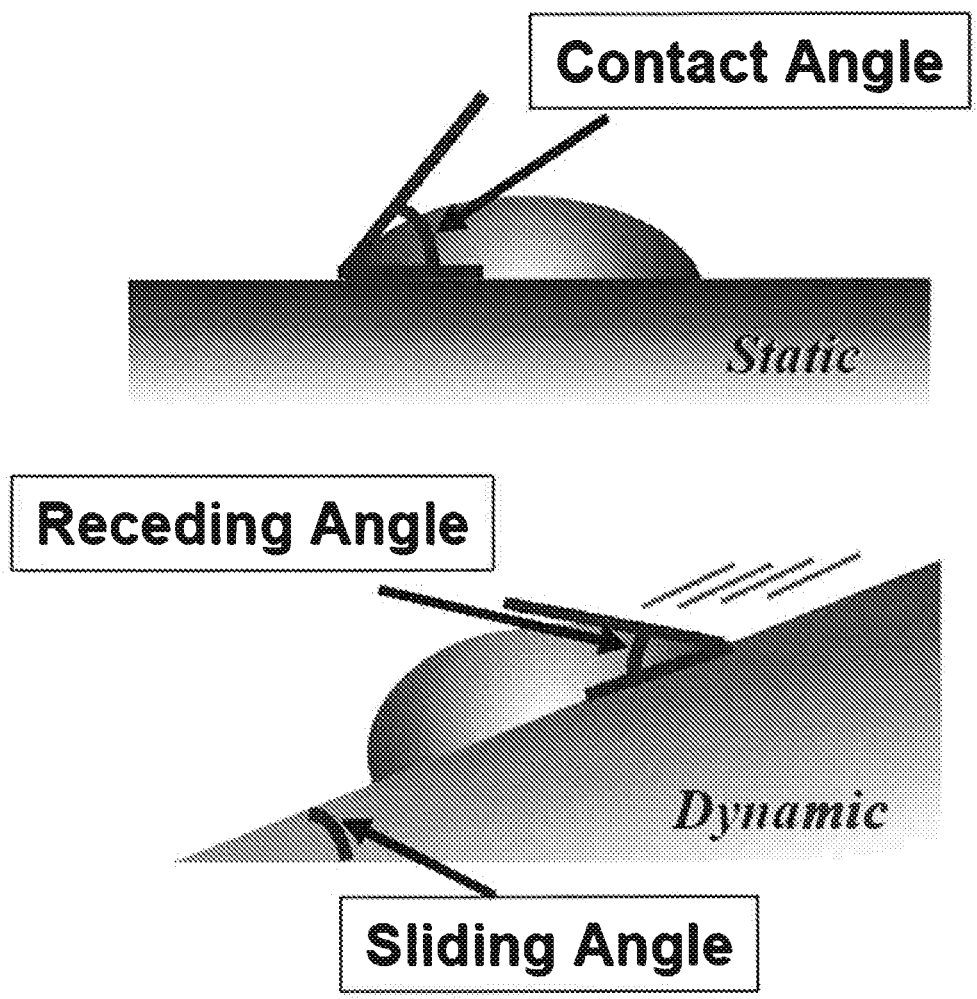
FIG. 2 identifies the contact angle (CA) and sliding angle (SA) with respect to a droplet overlying a surface.

The terms "Contact Angle" and "Sliding Angle" refer to the angles identified as such in FIG. 2. Further, the term "Rolling-down Angle" is used interchangeably herein with the term "Sliding Angle."

Polymers

Polymer embodiments in accordance with the present invention encompass a non-self imageable norbornene-type polymer, having repeating units represented by Formula I shown below. Polymer composition embodiments encompass at least such a polymer embodiment and a casting solvent, where such polymer composition embodiments provide for the forming of a top-coat or protective layer over a previously formed photoresist layer.

Such a top-coat or protective layer serves to receive on its surface an immersion liquid (fluid or medium), thus enabling an immersion photolithography process to be accomplished. Such layer enables the process by protecting or isolating the photoresist or imaging layer from the immersion fluid. Thus, the photoresist layer is physically removed (separated) from direct contact with the immersion fluid by the presence of the top-coat layer therebetween. In this manner, some or all of the aforementioned technical problems resulting from the presence of the immersion fluid and its contacting of the photoresist layer can be eliminated, avoided or at least their effects advantageously reduced. Further to such problems, such top-coat layer embodiments in accordance with the present invention provide advantageously high contact angles (CA) and low sliding angles (SA) with aqueous fluids, they can be characterized as being hydrophobic. It has been observed that when a top-coat layer exhibiting both a high CA and a low SA, as compared to other materials, is used during an aqueous based immersion lithographic process, little or no defectivity due to non-retained immersion fluid is observed over a wide range of scanning speeds. Where such a result is observed at or near the scanning speed employed for non-immersion lithography, it may be said that such protective or top coat layer has high scanability.

It has been found that to obtain a top coat layer with sufficiently high hydrophobicity, as defined by CA and SA values, the polymer used for forming such a layer will likely encompass one or more repeating units with fluorinated pendent groups or hydrocarbon pendent groups having little or no functionality. Exemplary fluorinated pendent groups include, among others, partially fluorinated or perfluorinated alkyl groups; alkyl ether groups or alkyl ester groups generally having two (2) or more carbon atoms; and alkaryl groups having both an alkyl portion and an aryl portion where one or both of such portions is at least partially fluorinated and where the alkyl portion generally has one (1) or more carbon atoms.

In addition to having sufficiently high hydrophobicity, as evidenced by providing high contact and low sliding angles, it is desirable that such top coat layers have sufficient aqueous base solubility so as not to impair the development of a desired image in an underlying photoresist layer. It has been found that such sufficient aqueous base solubility can be achieved by the inclusion of repeating units with pendent functional groups that encompass a Bronsted Acid moiety having a sufficiently low pKa value to be soluble in the aqueous base solution that is contemplated for use to develop the desired image in the underlying photoresist layer. One such Bronsted Acid moiety is a carboxylic acid group. Additionally it has been found that, fluorinated alcohol groups and fluorinated sulfonamide groups can also classified as Bronsted Acid moieties with a sufficiently low pKa value to provide aqueous base solubility while, advantageously, unlike a carboxylic group, being somewhat hydrophobic. For example, as shown in Tables L-1 and L-2, below, the various homopolymers of the previously known fluorinated alcohol 2-(bicyclo[2.2.1]hept-5-en-2-ylmethyl)-1,1,1,3,3,3-hexafluoropropan-2-ol (HFANB) and fluorinated sulfonamide N-(bicyclo[2.2.1]hept-5-ene-2-ylmethyl)-1,1,1-trifluoromethane sulfonamide (TFSNB), exhibit CAs and SAs in the ranges of 73 to 80 degrees and 16 to 23 degrees, respectively, where DRs range from 175 to 2254 nm/sec.

However, while the CAs, SAs and DRs of the HFANB and TFSNB homopolymers have shown promise, neither provides a combination of CA, SA and DR that enables the forming of a top coat layer that provides a scanning speed, during immersion lithography, that is at or near the scanning speed employed for non-immersion lithography. That is to say that neither homopolymer exhibits high scanability.

Further to the combination of both excellent hydrophobicity and aqueous base solubility, providing polymers capable of forming films that have a CA in excess of 80 degrees and a SA of 10 degrees or less while also providing a DR in excess of 750 nm/sec are also more desirable. Further still to the combination of both excellent hydrophobicity and aqueous base solubility, providing polymers capable of forming films that have a CA in excess of 82 degrees and a SA of 8 degrees or less while also providing a DR in excess of 950 nm/sec are desirable. With regard to carboxylic acid functional groups, such groups can advantageously provide high aqueous base solubility, but are generally hydrophilic in nature and thus, when included in a polymer, reduce CA and increase SA of a layer formed therefrom. Therefore, polymer embodiments in accordance with the present invention are generally inclusive of several types of repeating units to provide for the tailoring of a polymer's composition to provide the specific degree of hydrophobicity and aqueous base solubility desired. Such several types of repeating units including the aforementioned exemplary functional groups as well as repeating units with fluorinated pendent groups or hydrocarbon pendent groups having little or no functionality, as mentioned above and spaced functional group repeating units as will be discussed below.

Recently, however, studies by Nikon indicate that "the contact angle of the resists/topcoat did not correlate to the max scan speed, with successful scanning achieved at greater than 500 mm/second for not only hydrophobic coatings (static contact angle >100 degrees), but also for hydrophilic coatings (static contact angle ~60 degrees). Instead, the sliding angle of a 50-micro-liter water droplet was determined to be a stronger indication of materials with insufficient scanning capabilities. Nikon confirmed a sliding angle less than 40 degrees is a necessary condition for scanning at speeds greater than 500 mm/seq free of bubbles" (See, "*Immersion Lithography: System Design and Its Impact on Defectivity*", Nikon, Summer 2005). Therefore, considering only SA and DR, providing polymers capable of forming films that have a SA of 10 degrees or less while also providing a DR in excess of 950 nm/sec are desirable. Further, providing polymers capable of forming a SA of 8.5 degrees or less while also providing a DR in excess of 650 nm/sec are also desirable and providing polymers capable of forming a SA of 6.5 degrees or less while also providing a DR in excess of 350 nm/s also lead to desirable results.

Therefore, in addition to using functional groups such as carboxylic acids, fluorinated alcohols or fluorinated sulfonamide groups in top-coat polymers, it has also been found that the high hydrophobicity required for immersion lithography use can be achieved by incorporating spacers into such pendent groups. That is to say that the functional moiety of the pendent group is spaced away from the polymer backbone. Thus the top-coat polymer embodiments in accordance with the present invention include functionalized pendent groups having spacers selected from alkyl, —CH$_2$O— (ether) and —O—CH$_2$—CH$_2$—O— (glycol) moieties, where such alkyl moieties are inclusive of 1 to 6 carbon atoms, such ether moieties are inclusive of 1 to 4 ether groupings and such glycol moieties are inclusive of from 1 to 3 such glycol groupings Thus, in some embodiments in accordance with the present invention, a non-self imageable polymer achieving both aqueous base solubility and hydrophobicity and encompassing at least one repeating unit represented by Formula I is provided:

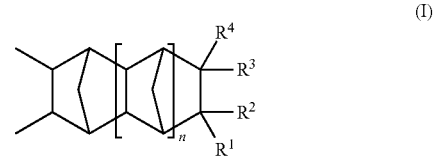

(I)

In Formula I, n is an integer from 0 to 5 inclusive. Also in Formula I, each $R^1$, $R^2$, $R^3$ and $R^4$ independently represents hydrogen, a linear or branched alkyl group, or a linear or branched haloalkyl group, while at least one of $R^1$ to $R^4$ is one of:

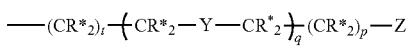 (A)

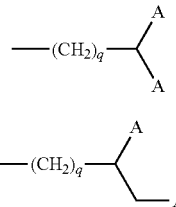 (B)

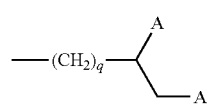 (C)

where Z is a Bronsted acid group with a p$K_a$ less than 11; Y is O or S; t is an integer from 0 to 5; p is an integer from 0 to 3; each q is independently an integer from 1 to 3; R* independently represents a hydrogen, a methyl group or an ethyl group; and each A in groups (B) and (C) is group (A) as defined above. Exemplary Bronsted acid groups include, but are not limited to, fluorinated alcohols, fluorinated sulfonamides and carboxylic acids such as groups (D), (E), and (F) depicted below

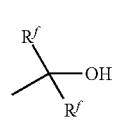 (D)

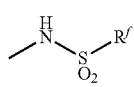 (E)

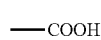 (F)

where $R^f$ independently $C_nQ_{2n+1}$, where Q independently represents F or H; with the proviso that at least one Q is F; and where n independently represents an integer from 1 to 4.

Some embodiments of the top-coat composition encompass a top coat composition of the aforementioned non-self imageable polymer where Z is selected the group represented by Formulae E or F and further some embodiments encompass at least one additional norbornene-type repeating unit distinct form said first norbornene-type repeating unit.

Some embodiments of the immersion lithographic method encompass a top coat composition of the aforementioned non-self imageable polymer where Z is selected from the group represented by Formulae E or F, and further some embodiments encompass one or more of an acidic moiety or a surfactant where the solvent is selected from n-butyl alcohol, isobutyl alcohol, n-pentanol, 4-methyl-2-pentanol, 2-octanol, 2-perfluorobutyl ethanol ($C_4F_9CH_2CH_2OH$), perfluoropropyl methanol (($C_3F_7$)($CH_2OH$)), $H(CF_2)_2CH_2$—O—($CF_2)_2$—H, $H(CF_2)_7$—(CO)O—$CH_3$, $H(CF_2)_4$—(CO)O—$C_2H_5$, diisopropylether, diisobutylether, dipentylether, methyl-t-butylether and mixtures thereof.

In a top-coat polymer embodiment in accordance with the present invention, a desired average molecular weight ($M_W$) of the polymers is from 2,000 to 80,000. In other embodiments, $M_W$ is from 2,000 to 30,000 and in still other embodiments from 2,000 to 15,000. However, it should be understood that other embodiments in accordance with the present invention encompass top-coat polymers having other average molecular weight ranges, and that such polymers can have either a higher or lower $M_W$ than is provided with the exemplary $M_W$ ranges above. Thus such other $M_W$ ranges will be understood to be within the scope of the present invention. Further to the $M_W$ ranges provided above, it will be noted that $M_W$ for any polymer referred to herein is measured using gel permeation chromatography (GPC) with an appropriate standard, unless otherwise noted.

Appropriate catalysts for the vinyl-addition polymerization of monomers of the present invention are palladium coordination polymerization catalysts Advantageous catalysts of this type are disclosed in U.S. Pat. No. 6,455,650 B1 and U.S. Pat. No. 6,903,171 B2.

It should be understood that some top-coat polymer embodiments of the present invention encompass polymers having repeating units represented by formula I. Additionally, some embodiments of the present invention encompass repeating units that are not within the scope of such formula. For example, some embodiments that encompass non-norbornene type monomers such as monomers based on ethylene, CO, methacrylate, acrylate or others could possibly be used. In the case of such monomers, other methods of polymerization would also need to be used in most cases. For example, in the case of the polymerization of polymers based on methacrylate or acrylate, free radical initiators, rather than catalysts, would in many cases need to be used to accomplish the polymerization. Advantageous radical polymerization initiators and techniques of such polymerization are disclosed in the *Encyclopedia of Polymer Science*, John Wiley & Sons, 13, 708 (1988). It should further be noted that the specific amount of any particular repeating unit present within the polymer is the result of a "polymer design" process. That is to say, a repeating unit's physical and chemical properties are determined, often by forming a homopolymer thereof, and such physical and chemical properties of the homopolymer are compared to the desired properties of the layer to be formed. Based upon this comparison, one or more other repeating units are selected and test compositions of such polymers have been made and in turn formed into layers where physical and chemical properties are determined. As an example of such a polymer design process, homopolymers of several norbornene-type monomers have been formed and then cast into films for which contact angle and sliding angle measurements have been made. Based on the measurements from the aforementioned homopolymers, a polymer having two or more types of repeating units can be formed having a high contact angle and a low sliding angle and/or a desirable dissolution rate in an aqueous base solution such as 0.26N TMAH.

Monomers and Polymerizations

The foregoing non-self imageable polymers, represented by any one or more types of repeating units represented by one or more appropriate Formula I, are typically derived from appropriate analogous monomers. Thus, by way of an example, where a repeating unit such as:

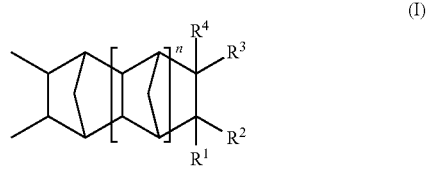 (I)

is desired, the analogous monomer (IA), shown below, can be employed in the forming of the polymer:

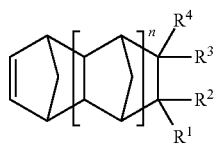

IA

In an embodiment in accordance with the present invention where a polymer having a type of repeating unit represented by Formula I is desired, such polymer can be prepared by addition polymerization (2, 3 enchainment) of appropriate, analogous monomers of the desired repeating units; where such addition polymerizations are carried out in the presence of a single or multi-component Group VIII transition metal catalyst as discussed previously herein.

For embodiments in accordance with the present invention, the aforementioned addition polymerization is effected by contacting the desired monomers with a palladium catalyst complex, a chain transfer agent and an optional activation agent. Exemplary catalysts are described in U.S. Pat. No. 6,455,650 B1 (the '650 patent) and PCT Application Number WO 2005/042147 A2 (the '147 application), the pertinent part of both are incorporated herein by reference.

In the '650 patent, catalyst complex is generally described as:

  Catalyst Formula I where M represents a Group 10 transition metal such as palladium; R' represents an anionic hydrocarbyl ligand; L' represents a Group 15 neutral electron donor ligand such as a phosphorus containing ligand; L" represents a labile neutral electron donor ligand; x is 1 or 2; y is 0, 1, 2, or 3, wherein the sum of x, y, and z is 4; and b and d are numbers representing the number of times the cation complex and weakly coordinating counter-anion complex (WCA), respectively, are taken to balance the electronic charge of the overall catalyst complex.

In the '147 application, the catalyst complexes are described as being derived from:

  Catalyst Formula Ia

  Catalyst Formula Ib

Where in Catalyst Formula Ia, $E(R)_3$ represents a Group 15 neutral electron donor ligand where E is selected from a Group 15 element of the Periodic Table of the Elements, and R independently represents hydrogen (or one of its isotopes), or an anionic hydrocarbyl containing moiety; Q is an anionic ligand selected from a carboxylate, thiocarboxylate, and dithiocarboxylate group; LB is a Lewis base; WCA represents a weakly coordinating anion; a represents an integer of 1, 2, or, 3; b represents an integer of 0, 1, or 2, where the sum of a+b is 1, 2, or 3; and p and r are integers that represent the number of times the palladium cation and the weakly coordinating anion are taken to balance the electronic charge on the structure of Catalyst Formula Ia. In an exemplary embodiment, p and r are independently selected from an integer of 1 and 2. And where in Formula Ib, E, R, r, p and $E(R)_3$ are as defined for Catalyst Formula Ia, and where $E(R)_2R^*$ also represents a Group 15 neutral electron donor ligand where $R^*$ is an anionic hydrocarbyl containing moiety, bonded to the Pd and having a P hydrogen with respect to the Pd center. In an exemplary embodiment, p and r are independently selected from an integer of 1 and 2.

It has also been found that in Catalyst Formula Ia, Q can be selected from acetyl acetonate ("acac") and its derivatives. Such derivatives can be thio derivatives where one or more of the acac oxygens are replaced with a sulfur atom or alkyl derivatives where one or more acac hydrogens are replaced with an appropriate substituent. Where Q is acac or a derivative thereof, a is an integer of 1 or 2; b is an integer of 0 or 1, and the sum of a+b is 1 or 2.

As stated herein, a weakly coordinating anion (WCA) is defined as a generally large and bulky anion capable of delocalization of its negative charge, and which is only weakly coordinated to a palladium cation of the present invention and is sufficiently labile to be displaced by solvent, monomer or neutral Lewis base. More specifically, the WCA functions as a stabilizing anion to the palladium cation but does not transfer to the cation to form a neutral product. The WCA anion is relatively inert in that it is non-oxidizing, non-reducing, and non-nucleophilic.

Examples of the single component catalysts that can be used for the polymerization are selected from those catalysts listed on page 15 of U.S. Pat. No. 7,759,439 B2, incorporated by reference herein. Such list including, among others, Pd-1206, Pd-1394 and $Pd_2(dba)_3$.

Representative cocatalyst compounds are also found in the aforementioned list of the '810 published application and include, among others, lithium tetrakis-(pentafluorophenyl) boratediethyletherate (LiFABA) and N-dimethylanilinium tetrakis-(pentafluorophenyl)borate (DANFABA). Still other suitable activator compounds are also described in the aforementioned '650 patent.

In accordance with some multi-component catalyst embodiments of the present invention, monomer to catalyst to cocatalyst molar ratios can range from 500:1:5 to 20,000:1:5 or from 500:1:1 to 20,000:1:1. In some such embodiments, molar ratios are from 5,000:1:4 to 1,000:1:2, and in still other such embodiments, molar ratios of from 3,000:1:3 to 1,000:1:2 are advantageous. One example in accordance with embodiments of the present invention has a monomer to catalyst to cocatalyst molar ratio of 1,000:1:6. It should be recognized that appropriate molar ratios can and will vary depending, among other things, on the activity of a particular catalyst system, the reactivity of the monomer selected, and the molecular weight of the resulting polymer that is desired. In addition, for embodiments of the present invention where single component catalysts are employed, the step of adding a cocatalyst can be eliminated. However, generally a ratio of from 5,000:1:4 to 5,000:1:2, and in particular from 2,000:1:3 to 1,000:1:3 have been found useful.

Suitable polymerization solvents for the addition polymerization reactions include aliphatic and aromatic solvents. These include aliphatic (non-polar) hydrocarbons such as pentane, hexane, heptane, octane and cyclohexane; halogenated alkane solvents such as dichloromethane, chloroform, carbon tetrachloride, ethyl chloride, 1,1-dichloroethane, 1,2-dichloroethane, 1-chloropropane, 2-chloropropane, 1-chlorobutane, 2-chlorobutane, 1-chloro-2-methylpropane, and 1-chloropentane; esters such as ethylacetate, i-amyl acetate; ethers such as diethylether; aromatic solvents such as benzene, toluene, o-, m-, and p-xylene, mesitylene, chlorobenzene, O-dichlorobenzene, Freon® 112 halocarbon solvent, fluorobenzene, o-difluorobenzene, p-difluorobenzene, pentafluorobenzene, hexafluorobenzene, and o-dichlorobenzene. Water may be used as the solvent. Other organic solvents such as diethyl ether, tetrahydrofuran, acetates (e.g., ethyl acetate), esters, lactones, ketones and amides may be useful. Mixtures of two or more of the aforementioned solvents may be useful.

In a solution process, the polymerization reaction may be carried out by adding a solution of the preformed catalyst or individual catalyst components to a solution of the norbornene-type monomer or mixtures of monomers to be polymerized. In some embodiments, the amount of monomer dissolved in the solvent ranges from 5 to 50 weight percent (wt %), and in other embodiments from 10 to 30 wt %, and in still other embodiments from 10 to 20 wt %. After the preformed catalyst or catalyst components are added to the monomer solution, the reaction medium is agitated (e.g. stirred) to ensure complete mixing of catalyst and monomer components and is generally heated for a period of time adequate for the polymerization, which in an embodiment is generally for a period of less than twenty four hours.

For embodiments in accordance with the present disclosure, the polymers are formed using either a batch polymerization process or what is referred to herein as a semi-batch polymerization process. For the former, a reaction initiator is added to a reaction vessel containing a solution encompassing all of the monomers that will be used in the polymerization. While for the latter a metered polymerization process is employed where one or more of the monomers for the polymerization are metered into the reaction vessel containing the reaction initiator at predefined rates such as described and disclosed in U.S. Pat. No. 7,858,721B2 at column 11, lines 13 to 20, and continuing at column 11, lines 41-54.

While the reaction temperature of the polymerization reaction can range from 0° C. to 150° C., generally temperatures from 10° C. to 120° C. or even from 60° C. to 80° C. have been found to be advantageous.

Polymer Compositions

Some embodiments in accordance with the present invention encompass compositions of the top-coat polymer embodiments previously discussed, where such top-coat compositions encompass an appropriate polymer, having any of the appropriate repeating units in the molar ratios and $M_W$ ranges previously disclosed, an appropriate casting solvent and one or more optional components (additives) that are selected to provide for the forming of a film over a photoresist layer, and/or enabling the desired performance of such a film during an immersion lithographic process. Such compositions are useful for forming a film overlaying a substrate as will be discussed in more detail below.

Some polymer composition embodiments of the present invention can encompass a blend of appropriate amounts of two or more distinct top-coat polymers, such as are described above, an appropriate casting solvent and optionally, one or more additives. That is to say, top-coat composition embodiments in accordance with the present invention can encompass blends of two or more top-coat polymers.

Useful casting solvents for the aforementioned top-coat polymer composition embodiments of the present invention are solvents capable of dissolving the polymer while not being miscible with a photoresist film previously formed on a substrate. Such solvents generally include alcoholic solvents having from 1 to 10 carbon atoms, partially or wholly-fluorinated alcoholic solvents having from 1 to 10 carbon atoms, partially or wholly-fluorinated alkyl ether solvents having from 4 to 15 carbon atoms, and partially or wholly-fluorinated alkyl ester solvents having from 4 to 15 carbon atoms. Exemplary solvents in accordance with the above criteria are n-butyl alcohol, isobutyl alcohol, n-pentanol, 4-methyl-2-pentanol, 2-octanol, 2-perfluorobutyl ethanol ($C_4F_9CH_2CH_2OH$), perfluoropropyl methanol ($(C_3F_7)(CH_2OH)$), $H(CF_2)_2CH_2$—O—$(CF_2)_2$—H, $H(CF_2)_7$—(CO)O—$CH_3$, $H(CF_2)_4$—(CO)O—$C_2H_5$, isopropylether, diisobutylether, dipentylether, methyl-t-butylether and mixtures thereof.

As mentioned above, the top-coat composition embodiments in accordance with the invention can further contain one or more optional additives. One such optional additive is a surfactant such as XR-104 (a trade name of Dainippon Ink and Chemicals, Inc.), to which, however, the invention should not be limited. Other optional additives include, among others, acidic moieties, dissolution inhibitors, plasticizers, stabilizers, colorants and halation prevention agents.

Top-coat composition embodiments of the present invention are employed for forming top-coat or layer films overlying a photoresist film formed on a substrate. Such films are generally for receiving an immersion fluid such as is employed in an immersion lithographic process. Generally the thickness of such a top-coat film, in some embodiments, is from 10 nanometers (nm) to 2000 nm. In some embodiments, it can be from 20 nm to 200 nm and in other embodiments from 30 nm to 160 nm. It will be understood, however, that other film thicknesses, greater than or less than the ranges provided above are also useful and thus are within the scope of the embodiments of the present invention. It will also be understood, that obtaining any particular film thickness from the appropriate use of a top-coat composition of the present invention is dependent on the method of coating employed as well as the amount of top-coat polymer, and of any optional additives present, within such a composition. Where a spin coating method is used (described more fully below) it is found that for some embodiments a range of the amount of top-coat polymer is from 0.1 weight percent (wt %) to 30 wt %, while in other embodiments such amount is from 0.3 wt % to 15 wt % and in still other embodiments from 0.5 wt % to 7.5 wt %. Such values of wt % being with respect to the total amount (weight) of such top-coat composition. It will be understood, however, that ranges for the amount of top-coat polymer, greater than or less than the ranges provided above are also useful and thus are within the scope of the embodiments of the present invention.

When an optional surfactant is added to such a top-coat composition, some embodiments employ a range of such surfactant of from 0.001 wt % to 10 wt %, other embodiments from 0.01 wt % to 1 wt %, and still other embodiments from 0.05 wt % to 0.5 wt %, such amounts being with respect to the amount of top-coat polymer in such a composition. When an optional acidic moiety is added to such a top-coat composition, some embodiments employ a range of such acidic compound of from 0.1 wt % to 10wt %, other embodiments from 0.2 wt % to 5 wt %, and still other embodiments from 0.3 wt. % to 1 wt %, such amounts being with respect to the amount of top-coat polymer in such a composition.

Immersion Lithographic Processes

Some immersion lithographic process embodiments in accordance with the present invention use previously described imageable polymer composition embodiments (photoresist compositions) for forming an imageable layer overlying a substrate, for example, a semiconductor substrate. In such embodiments, a photoresist composition is first applied to the surface of a substrate such as a silicon wafer using a spin coat to form a photoresist layer having a first desired thickness. A protective layer having material described above is then applied over the photoresist layer. The protective layer can be applied in a similar manner to the photoresist, such as by using a spin coat. The layers are then imagewise exposed, for example using ArF excimer laser (193 nm) through a desired mask pattern. The resulting image on the photoresist layer is obtained when the image is developed using an alkali developing liquid. In an embodiment in accordance with the present invention, before the protective layer is applied, the photoresist layer overlying the active surface of the substrate is first heated to a first temperature for a first period of time, then after the protective layer is applied, the photoresist layer and the protective layer overlaying it are heated to a second temperature for a second period of time. In a further embodiment, after the imagewise exposure, the layers are post exposure baked (PEB) for a third temperature and a third period of time and then, after cooling, the image is developed using an alkali developing liquid. Generally the temperatures at which the layers are heated in each of the heating steps are at from 70° C. to 140° C. from 40 to 180 seconds, and in some embodiments from 60 to 90 seconds (sec). PEB is generally conducted using the same or similar times and temperatures to the earlier heating steps. The alkali developing liquid is generally 0.1 to 10 wt % aqueous solution of tetramethylammonium hydroxide (TMAH) and typically a 0.26N TMAH solution. In this manner, a resist pattern faithful to the mask pattern is obtained.

Furthermore, while ArF excimer lasers are found advantageous for the imaging of the photoresist layers formed from imageable polymer compositions of the present invention, it should be noted that other types of radiation are also effective for forming patterned photoresist layers. For example, longer wavelengths such as 365 nm and shorter wavelengths such as are obtained from $F_2$ lasers, EUV (extreme ultraviolet radiation) sources, VUV (vacuum ultraviolet radiation) sources, electron beams, X-rays and soft X-rays can also be effectively used.

Advantageously, the top-coat layers of the present invention are soluble in the aqueous alkali developer solutions used. Therefore, upon exposure to such a solution, the top-coat layer is readily removed to completely present the photoresist layer to the developer solution. In this manner a resist pattern faithful to the mask pattern is obtained without the need for a separate top-coat removal step. It should be noted that top-coat layer forming compositions of the present invention are suitable for use with any appropriate photoresist material, where by appropriate it is meant a photoresist material that exhibits little or no intermixing with the protective layer forming composition.

The following description of a lithographic system, which may be used with the foregoing top-coat compositions and/or photoresist compositions as each are formed, is presented in the exemplary context of fabricating a plurality of integrated circuits (IC) formed on/in a semiconductor substrate (wafer). Exemplary ICs include general purpose microprocessors made from thousands or millions of transistors, dynamic, static or flash memory arrays or any other dedicated circuitry. However, one skilled in the art will appreciate that the methods and devices described herein can also be applied to the fabrication of any article manufactured using lithography, such as micro-machines, disk drive heads, gene chips, micro electromechanical systems (MEMS), and the like.

An exemplary IC processing arrangement can include an immersion lithographic system used to image a pattern onto a wafer or a region of the wafer. A photoresist composition or imaging layer overlies the wafer. The lithographic system may be, for example, a step-and-repeat exposure system or a step-and-scan exposure system, but is not limited to these exemplary systems. The lithographic system can include a light source and lens array or structure for directing light energy towards a mask (sometimes referred to as a reticle) and then to the imaging layer over the substrate. While the light energy typically has a wavelength of 193 nm, other higher or lower wavelengths, such as examples 157 nm or 248 nm can also be employed.

The mask selectively blocks light energy such that a light energy pattern defined by the mask is transferred towards the wafer. An imaging subsystem, such as a stepper assembly or a scanner assembly or combinations thereof, sequentially directs the energy pattern transmitted by the mask to a series of desired locations on the wafer. The imaging subsystem may include a series of lenses and/or reflectors for use in scaling and directing the energy pattern towards the wafer in the form of an imaging (or exposure) light energy pattern.

The imaging pattern (or exposure pattern) is transmitted by the imaging subsystem through an immersion medium that will generally have a relatively high index of refraction (e.g., an index of refraction greater than 1 but less than the index of the imaging layer). The immersion medium is generally a liquid. In one example, purified de-ionized water is used in conjunction with a 193 nm light source (e.g., an argon fluorine (ArF) laser).

The top-coat composition embodiments in accordance with the present invention can be used in forming a top-coat layer overlying a photoresist imaging layer. Such a top-coat layer receives the immersion material and prevents or inhibits ingress of such immersion medium (IM), or components thereof into the underlying imaging layer. In this manner, patterns on the resist that are unfaithful to the original mask pattern as a result of the IM can be prevented or at least inhibited.

Thus, in some embodiments in accordance with the present invention, a process for generating an image on a substrate encompasses: (a) first coating a substrate with a photoresist composition to form an imaging layer thereon; (b) second coating a substrate with a top-coat composition in accordance with the present invention to form a top-coat layer overlying the imaging layer; (c) imagewise exposing the substrate and overlying layers to appropriate radiation; and (d) developing an image. It should be further noted that for step (a), above, the photoresist composition can be essentially any composition that when formed into a layer, has essentially no interaction with the top-coat polymer or the solvent used to form the castable top-coat polymer layer composition thereof.

For each of the above described processes, the first coating involves coating the substrate with a film encompassing a photoresist composition. Suitable substrates encompass silicon, ceramics, polymer or the like. The second coating serves to overlay the imaging layer with a film formed from a top-coat composition in accordance with the present invention. Imagewise exposing encompasses exposing selected portions of the imaging or photoresist layer to appropriate radiation. Finally, developing the image encompasses first removing any top-coat layer that may have been formed and then developing the image created by the imagewise exposure. Since any top-coat layer formed using a top-coat composition in accordance with the present invention is soluble in aqueous base solution and since such solutions are also used for developing images in typical imaging layers, embodiments in accordance with the present invention can utilize the same solvent for both top-coat removal and image developing. In some embodiments, a unitary process can be employed for both top-coat removal and image development. Suitable solvents materials for such a unitary process include aqueous base solutions, for example, an aqueous base without metal ions, such as 0.26 N TMAH or other appropriate aqueous base solutions.

An embodiment in accordance with the present invention also relates to an integrated circuit assembly such as an integrated circuit chip, multichip module, or circuit board made by the process of the present invention. The integrated circuit assembly encompasses a circuit formed on a substrate by any of the coating, exposing and developing processes described above.

After the substrate has been exposed, developed and etched, circuit patterns can be formed in the exposed areas by coating the substrate with a conductive material such as conductive metals by art known techniques such as evaporation, sputtering, plating, chemical vapor deposition, or laser induced deposition. The surface of the film can be milled to remove any excess conductive material. Dielectric materials may also be deposited by similar techniques during the process of making circuits. Inorganic ions such as boron, phosphorous, or arsenic can be implanted in the substrate in the process for making p or n doped circuit transistors. Other techniques for forming circuits are well known to those skilled in the art.

Typically, once formed, the top-coat layer exhibits at least one of the following desirable properties: 1) rapid dissolution in an aqueous base developer (as an example, 0.26N tetramethylammonium hydroxide (TMAH); and 2) high transparency or low optical density at the wavelength used for imagewise exposure, for example, 193 nm. The first property is desirable so that the top-coat layer is readily integrated into a typical patterning process flow. The second property is desirable so that the top-coat layer does not interfere with the lithographic performance of the imaging layer.

The following examples include detailed descriptions of polymerizations, and the monomers used therein. Such descriptions may be used to prepare the polymers employed in the embodiments of the present invention. While these examples and the materials described therein fall within the scope of embodiments of the present invention, they are presented for illustrative purposes only, and are not intended as a restriction on such scope. Other examples presented herein relate to characteristics of the polymers and polymeric compositions that are embodiments of the present invention. Such characteristics are of interest for enabling polymer design embodiments of the present invention as well as for demonstrating that such polymer and polymer compositions of the present invention are useful for immersion lithography processes as described herein.

As used in the polymerization examples and throughout the specification, ratios of monomer to catalyst and cocatalyst are molar ratios. Further, in the examples the terms "sparging" or "sparged" are used repeatedly, such terms will be understood to refer to the passing of nitrogen gas through a liquid to remove dissolved oxygen. Still further, a number of acronyms or abbreviations are used in the examples. To aid in the understanding of these examples, the following listing of such acronyms or abbreviations with their full meaning is provided below:

THF: Tetrahydrofuran

NaH: Sodium hydride

NBCH$_2$OH: bicyclo[2.2.1]hept-5-en-2-ylmethanol

NBCH$_2$CH$_2$OH: 2-(bicyclo[2.2.1]hept-5-en-2-yl)ethanol

NBCH$_2$CH$_2$CH$_2$OH: 4-(bicyclo[2.2.1]hept-5-en-2-yl)butan-1-ol

NaNBMMHFP: sodium 2-((bicyclo[2.2.1]hept-5-en-2-ylmethoxy)methyl)-1,1,1,3,3,3-hexafluoropropan-2-olate NBMMHFP: heptan-2-ylmethoxy)methyl)-1,1,1,3,3,3-hexafluoropropan-2-ol NaNBBMHFP: sodium 2-((bicyclo[2.2.1]hept-5-en-2-ylbutoxy)methyl)-1,1,1,3,3,3-hexafluoropropan-2-olate MeOH: Methanol $M_w$: Weight average molecular weight $M_n$: Number average molecular weight PDI: Polydispersity (PDI=$M_w$/$M_n$)

$^1$H-NMR: Proton nuclear magnetic resonance spectroscopy $^{13}$C NMR: Carbon nuclear magnetic resonance spectroscopy GPC: Gel permeation chromatography Additionally, the following monomer structures, shown with appropriate acronyms or abbreviations, are provided to further aid in the understanding of the examples.

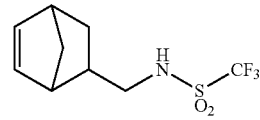

(M1)

N-(bicyclo[2.2.1]hept-5-en-2-ylmethyl)-1,1,1-trifluoromethanesulfonamide
TFSNB

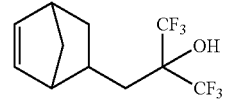

(M2)

2-(bicyclo[2.2.1]hept-5-en-2-ylmethyl)-1,1,1,3,3,3-hexafluoropropan-2-ol
HFANB

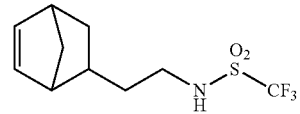

(M3)

N-(2-(bicyclo[2.2.1]hept-5-en-2-yl)ethyl)-1,1,1-trifluoromethanesulfonamide
TFSEtNB

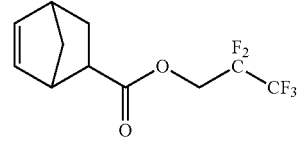

(M4)

2,2,3,3,3-pentafluoropropyl bicyclo[2.2.1]hept-5-ene-2-carboxylate
FPCNB

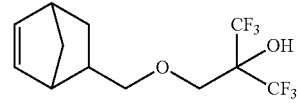

(M5)

2-((bicyclo[2.2.1]hept-5-en-2-ylmethoxy)methyl)-1,1,1,3,3,3-hexafluoropropan-2-ol
MMHFPNB

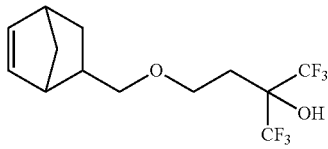

(M6)

2-((2-bicyclo[2.2.1]hept-5-en-2-yl)ethoxy)methyl)-1,1,1,3,3,3-hexafluoropropan-2-ol
EMHFPNB -continued

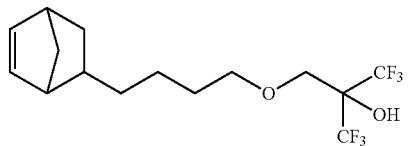

2-((4-bicyclo[2.2.1]hept-5-en-2-yl)butoxy)methyl)-
1,1,1,3,3,3-hexafluoropropan-2-ol
BMHFPNB (M7)

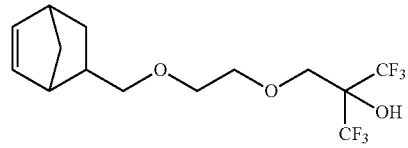

2-((2-bicyclo[2.2.1]hept-5-en-2-ylmethoxy)ethoxy)methyl)-
1,1,1,3,3,3-hexafluoropropan-2-ol
GlyMHFPNB (M8)

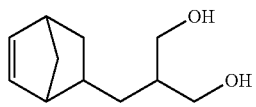

2-(bicyclo[2.2.1]hept-5-en-2-ylmethyl)propane-1,3-diol
MM(MOH)$_2$NB (M9)

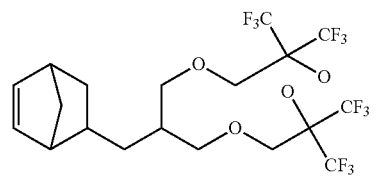

2,2'-(((2-(bicyclo[2.2.1]hept-5-en-2-ylmethyl)propane-1,3-
diyl)bis(oxy))bis(methylene))bis(1,1,1,3,3,3-hexafluoropropane-2-ol)
MM(MMHFP)$_2$NB (M10)

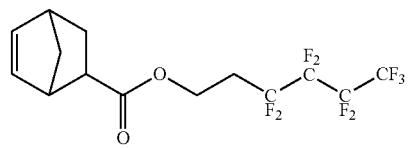

3,3,4,4,5,5,6,6,6-nonafluorohexyl bicyclo[2.2.1]hept-
5-ene-2-carboxylate
FHCNB (M11)

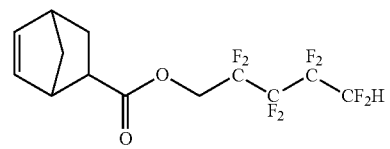

2,2,3,3,4,4,5,5-octafluoropentyl bicyclo[2.2.1]hept-
5-ene-2-carboxylate
FOHCNB (M12)

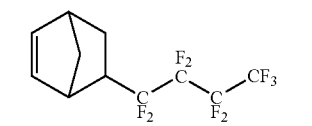

5-(perfluorobutyl)bicyclo[2.2.1]hept-2-ene
NBC$_4$F$_9$ (M13)

-continued

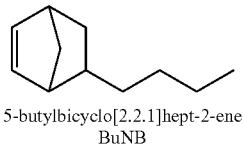

5-butylbicyclo[2.2.1]hept-2-ene
BuNB (M14)

Measurements of Contact Angle (CA) were made as follows: 3 μL drops of pure water were placed at three different locations on a coated substrate and the contact angle of the droplet at each location was determined using a commercial contact angle goniometer (Rame-Hart model #100-00). The value reported was the mean of the three measurements.

Measurements of Sliding Angle (SA) were made as follows: 50 μL was dispensed onto a coated substrate positioned in a proprietary instrument which can increase an incline angle of the substrate from a horizontal position (incline angle=0). The incline angle at which the drop began to slide was taken at the sliding angle. The value reported was an average of two measurements.

Measurements of Dissolution Rate were made as follows: In the clean room, polymer solutions (typically 20% in PGMEA, MIBC or iso-butanol) were spin coated onto 4 inch thermal oxide coated wafers at 500 rpm for 10 seconds, followed by a ramp to 2000 rpm for 60 seconds. The wafer was then soft baked at 130° C. for 120 seconds. The dissolution rate of the film in 0.26N tetramethylammonium hydroxide was measured by an interferometric method using a Thickness Detection Solutions DRM 420-L dissolution rate monitor.

Optical Density (OD) measurements: Samples were prepared by spin coating a 1-inch quartz wafer with an approximately 15 wt % solution of the desired polymer, typically in propylene glycol methylether acetate (PGMEA). After the samples were baked for 60 sec at 130° C. on a hotplate and allowed to cool, the optical absorbance of each was measured at 193 nm using a Cary 400 Scan UV-Vis spectrophotometer. A blank quartz wafer was used in the reference beam. To determine each sample's film thickness, a portion of the film was removed from the quartz wafer and the thickness was measured using a Tencor profilometer. Optical density was calculated as the ratio of absorbance/thickness (in microns). It should be noted that all of the OD values obtained revealed values sufficiently low to allow for exposure of an underlying photoresist layer without noticeable image degradation.

EXAMPLES

Monomer Synthesis Example S-1

Synthesis of TFSNB (M1)

Into a dry 1 L round bottom flask equipped with a magnetic stirrer and an addition funnel, was added 500 mL of dry tetrahydrofuran, 165 mL of triethylamine and 8 g (0.65 moles) of 5-norbornene-2-methylamine. The reaction mixture was cooled to 0° C. To this mixture was added via the addition funnel 100 g (0.59 moles) of 1,1,1-trifluoromethane-sulfonyl chloride and the reaction mixture was stirred overnight. The reaction mixture was filtered to remove the triethyl ammonium hydrochloride salt. The volatiles were removed from the filtrate by rotary evaporation resulting in a solid. The solid was dissolved in diethyl ether and the resulting solution was extracted several times with deionized water. After treating with decolorizing carbon and drying over anhydrous sodium sulfate, the organic phase was filtered and the solvent was removed by rotary evaporation. The resulting yellow oily product was eluted through a column of silica with hexane/ether (10:1) mixture to yield colorless oil in 60% yield. The product was identified by $^1$H, $^{13}$C NMR and mass spectrometry.

Monomer Synthesis Example S-2

Synthesis of TFSEtNB (M3)

Into a dry 1 L round bottom flask equipped with a magnetic stirrer and an addition funnel was added 500 mL of dry tetrahydrofuran, 59 g (0.58 moles) of triethylamine and 77 g (0.56 moles) of 5-norbornene-2-ethylamine. The reaction mixture cooled to 0° C. To this mixture was added via the addition funnel 98 g (0.58 moles) of 1,1,1-trifluoromethanesulfonyl chloride and the reaction mixture was allowed to warm to ambient temperature. The reaction mixture was stirred for 40 hours, filtered to remove the triethyl ammonium hydrochloride salt. The volatiles were removed from the filtrate by rotary evaporation resulting in 146 g of crude product. The crude product was dissolved in 330 g hexanes and 200 g tetrahydrofuran, extracted 3 times with 300 g of 20% sulfuric acid solution in water followed by 3 extractions with 300 g of deionized water. The organic solution was concentrated by rotary evaporation and distilled at reduced pressure using a short-path distillation head to obtain 102 g of the final product characterized by $^1$H NMR spectroscopy.

Monomer Synthesis Example S-3

Synthesis of MMHFPNB (M5)

NaH (60%, 554 g, 13.8 mol) was placed in a 4-neck 22-L flask fitted with mechanical stirrer, an addition funnel, a thermowell, and a condenser with a nitrogen gas inlet. 5300 ml dry THF was added and stirring was commenced. The resulting slurry was mechanically stirred while cooling to −13° C. Endo-/exo-NBCH$_2$OH (1,300 g, 10.47 mol) was dissolved in 1000 ml dry THF and added rapidly dropwise to the NaH/THF mixture. Addition time was 30 min with the temperature ranging from −13° C. to −2° C. When the temperature dropped to −4° C., the cooling bath was removed and the reaction was allowed to warm to room temperature and to stir overnight. The reaction was cooled to −11° C. and 1,900 g (10.55 mol) hexafluoroisobutylene epoxide (HFIBO) was added dropwise. Addition time was 2.5 hrs with the temperature ranging from −10° C. to +7° C. GC analysis showed that there was 15% endo-/exo-NBCH$_2$OH and 83.4% endo-/exo-MMHFPNB. The mixture was allowed to warm to room temperature where it began a small exotherm to 28° C. with vigorous off-gassing. After 6.6 hrs at room temperature, GC analysis showed 0.7% unreacted endo-NBCH$_2$OH and 91.4% endo-/exo-MMHFPNB.

Another 10.4 g HFIBO was added and the mixture was allowed to stir overnight. GC analysis showed 0.2-0.3% unreacted endo-/exo-NBCH2OH and 93.2-97.7% endo-/exo-MMHFPNB. The mixture was stirred another 5.25 hrs before cooling to −3° C. An initial 100 ml of water was added very slowly over 30 minutes to quench the sodium hydride. The temperature ranged from −3° C. to +8° C. When the exotherm ceased, 200 ml water of additional was added. The resulting solution was rotary evaporated to obtain 4082 g of a brown solid of NaNBMMHFP.

Following, the solid was split into three portions of 1743 g, 1712 g, and 627 g. Each was taken up respectively in 2000 ml, 1800 ml, and 750 ml of hot heptane. Hazy solutions resulted, which were filtered through a Celite filtering aid. The filtrates obtained were decanted from the precipitated NaOH. The solutions were allowed to cool overnight to precipitate hard crystals. These (R1) were collected by filtration to give 2094 g. GC analysis (on an acidified sample) showed 0.09% NBMeOH, 97.7% endo-/exo-MMHFPNB, and 2.0% endo-/exo-NBaMMHFP adducts. These crystals (R1) were dissolved in 2100 ml boiling heptane. The heptanes supernatant was decanted from the insoluble NaOH solids. The NaNBM-MHFP solution was mechanically stirred as it was cooled in an ice bath. Filtration of the resulting crystals in heptane yielded 1845 g (R2) for which GC analysis (on acidified sample) showed no NBCH$_2$OH, and 98.1% endo-/exo-MM-HFPNB. The initial mother liquor (ML1 from R1) was rotary evaporated. The resulting solids were collected by filtration, yielding 641 g with 0.04% NBCH$_2$OH and 96.5% MMHF-PNB. The filtrate (ML2) was rotary evaporated until solids precipitated. These were collected by filtration to give 422 g which showed by GC analysis (on an acidified sample) no NBCH$_2$OH, 98.2% MMHFPNB, and 1.7% NBMMHFP adducts.

The Celite filtering aid used previously was refluxed in ~1000 ml heptane and filtered. The filtrate was rotary evaporated to yield 199 g white solid. This was recrystallized from hot heptane to give 137 g which showed no NBCH$_2$OH, 98.3% MMHFPNB isomers, and 1.8% NBaMMHFP adducts. The mother liquor (ML3) from ML2 was rotary evaporated until solids precipitated. These were filtered and washed with heptane to give 34 g containing 0.3% NBCH$_2$OH. The mother liquor (R2ML) from R2 was rotary evaporated until solids precipitated. These were filtered and washed with heptane to obtain 239 g which showed no NBCH$_2$OH on GC analysis. The mother liquors from the Celite extraction and R2ML were combined and rotary evaporated until solids precipitated. These were filtered and washed with heptane to give 56.5 g which showed no NBCH$_2$OH upon GC analysis. The NaOH solids were heated with 200 ml heptane, poured through a Celite pad, and the resulting filtrate rotary evaporated to 39.8 g solids. These were recrystallized from heptane to give 34.7 g showing no NBCH$_2$OH by GC analysis. All solids and crystals <0.04% NBCH$_2$OH were combined to give 3332 g for 98% yield.

These were split into three portions and dissolved in water as follows: 1438.2 g in 1500 ml water, 1226 g in 1500 ml water, and 633 g in 750 ml water. To the 633 g/750 ml sample was added another 34.77 g dissolved in 75 ml water. The 1500 ml solutions were each acidified with 500 ml conc. HCl while the 825 ml solution was treated with 250 ml conc. HCl. The lower phases that separated were combined to yield 3736 g of hazy MMHFPNB liquid. This was washed with 500 ml and 1000 ml of 3.5N HCl and with 1000 ml brine. The liquid did not clarify. The liquid was split into two 1400 ml portions and each was diluted to 2000 ml with dichloromethane. Each solution was washed with 3×1000 ml brine to pH 4 and then dried over sodium sulfate. GC analysis of the dried solution showed no NBCH$_2$OH, 98.6% MMHFPNB isomers, and 1.4% NBaMMHFP adducts. The solution was filtered and rotary evaporated to give 3240 g. This was vacuum distilled through a 12-inch Vigreux column to recover the product at about 88.0° C. (1.8 Torr) for a total of 2298 g (72% yield). The final product was analyzed to be 98.4% endo/exo-MMHF-PNB and 1.7% NBaMMHFP isomers. Endo-/exo-ratio was 83:17.

Monomer Synthesis Example S-4

Synthesis of EMHFPNB (M6)

NaH (60%, 97 g, 2.43 mol, 1.5 equivalents) was placed in a 4-neck 5-L flask fitted with a mechanical stirrer, an addition funnel, a nitrogen gas inlet, and a thermowell. The reaction apparatus had been dried earlier by heating with a hot air drier to 130° C. under nitrogen flush. Dry THF (800 ml) was added and the resulting slurry was mechanically stirred while cooling to −11.3° C. Endo-/exo-NBCH$_2$CH$_2$OH (223 g, 1.62 mol) was dissolved in 200 ml dry THF and added rapidly dropwise to the NaH/THF mixture. Addition time was 6 minutes with the temperature ranging from −11 to −5° C. The reaction was warmed to room temperature and stirred overnight. The reaction was cooled to −13° C. and 299 g (1.66 mol) hexafluoroisobutylene epoxide (HFIBO) was added dropwise. Addition time was 26 min with the temperature warming to −7° C. The mixture was warmed to room temperature over a 1-hour period. GC analysis indicated 41% NBCH$_2$CH$_2$OH and 59% EMHFPNB. After 4 hrs at room temperatures, GC analysis detected 15% unreacted endo-/exo-NBCH$_2$CH$_2$OH. The mixture was heated to 34-41° C. for 3.5 hrs to give 4.6% NBCH$_2$CH$_2$OH and 89.5% EMHFPNB, Heating was continued overnight (14 hrs) at 34° C., giving 2.0% NBCH$_2$CH$_2$OH, and 93.3% EMHFPNB. Heating at 37-40° C. for another three hours gave no further progression of the reaction. The mixture was cooled to −8° C. and 800 ml water was added to quench. The mixture was washed with 3×300 ml heptane, which removed some unreacted NBCH$_2$CH$_2$OH, and then was acidified with 275 ml concentrated hydrochloric acid. The organic layer was separated from the lower aqueous phase and washed with 500 ml brine to a wash pH 2. GC analysis showed 1.8% NBCH$_2$CH$_2$OH, and 96.8% EMHFPNB. The organic phase was treated with 300 ml 25% aqueous NaOH and then rotary evaporated to remove first the THF and then water at from 20 to 2 Torr. This yielded 658.6 g of tan solid.

Following, the solid was dissolved in 500 ml hot heptane. The heptane portion was decanted from a lower aqueous phase that separated out. The heptane solution was chilled in a methanol/ice bath to induce crystallization. Filtration and wash with heptane yielded a white solid that contained 0.3% NBCH$_2$CH$_2$OH, and 98.9% EMHFPNB. The solid was recrystallized from 500 ml boiling heptane. The heptane solution was again decanted from a small amount of aqueous phase that separated. The heptane solution was chilled in methanol/ice and the resulting crystals were collected by filtration. This gave 401.18 g white solid that showed no NBCH$_2$CH$_2$OH present upon GC analysis. The sodium salt was dissolved in 500 ml warm water. The resulting heptane phase was separated. The remaining aqueous phase was acidified with 150 ml concentrated HCl to pH<2. After mixing well, the lower product phase was separated, giving 239.36 g of orange liquid.

This was diluted with 250 ml dichloromethane and washed with 2×200 ml 3.5N HCl to clarify. The dichloromethane solution was washed with 3×500 ml brine to pH 4. The solution was dried over sodium sulfate, filtered, and rotary evaporated to give ~260 g.

The material was distilled through a 12-inch Vigreux column, to give the following fractions: (1) 49-78° C. (1.30-1.50 torr), 7.08 g, 99.5% EMHFPNB, 0.2% NBCH$_2$CH$_2$OH; (ii) 73-69° C. (0.97 torr), 122.14 g, 99.8% MMHFPNB, 0.13% NBCH$_2$CH$_2$OH, and (iii) 70-67° C. (1.15-0.91 torr), 113.68 g, 99.7% EMHFPNB, no NBCH$_2$CH$_2$OH detected. Yield of >99.7% purity product was 235.82 g (46% yield).

Monomer Synthesis Example S-5

Synthesis of BMHFPNB (M7)

NaH (60%, 32.8 g, 0.82 mol, 1.5 equivalent) was placed in a 4-neck 2-L flask fitted with mechanical stirrer, addition funnel, nitrogen gas inlet, and thermowell. Dry THF (320 ml) was added and the resulting slurry was mechanically stirred while cooling to −12° C. Endo-/exo-NBCH$_2$CH$_2$CH$_2$CH$_2$OH (NBBuOH) (90.9 g, 0.547 mol) was dissolved in 60 ml dry THF and was added rapidly dropwise to the NaH/THF mixture. Addition time was 14 min with the temperature ranging from −13° C. to −11° C. The mixture was allowed to warm to room temperature and stir overnight. The reaction was cooled to −9° C. and 101.9 g (0.566 mol) hexafluoroisobutylene epoxide (HMO) was added dropwise. Addition time was 9 min with the temperature ranging from −9° C. to −4° C. The mixture was allowed to warm to room temperature within 45 minutes. GC analysis showed 50.6% unreacted NBBuOH and 44.8% HFIBO adduct. GC analysis obtained after 9 hrs at room temperature showed 9.5% of unreacted NBBuOH and 83.4% of product. An additional 19 hrs at room temperature gave 4.7% unreacted NBBuOH and 90.9% product. Another 10.8 g HFIBO was added. After 10 minutes, GC analysis showed 4.6% of unreacted NBBuOH and 91.5% product. The mixture was heated from 30-39° C. for one hour. GC analysis showed 2.4% of unreacted NBBuOH and 91.7% product. The mixture was stirred at room temperature for another three days, giving a total reaction time of 119.4 hours. GC analysis showed no starting material remaining, while product conversion was 93.8%. Also present were 4% of unknown impurities, presumed to be the double HFIBO adducts. The mixture was cooled to −14.2° C. and 330 ml water was added to quench. After four minutes, the temperature reached −2.1° C. and no further exotherm occurred. The remaining water was then added rapidly. The cold mixture was extracted with 3×300 ml heptane. The heptane extracts removed the HFIBO oligomers and some of the suspected double HFIBO adduct. The composition of the heptane extracts was 41.3% product, 12.2% presumed double HFIBO adduct, and >45% oligomers. The heptane extracts were rotary evaporated to 28.42 g.

The aqueous phase was acidified to pH<2 with 70 ml concentrated hydrochloric acid. The phases were separated and the upper organic phase was washed with 2×250 ml brine to pH 5. This was dried over sodium sulfate, filtered and rotary evaporated to 185 g (98% yield) yellow liquid. GC analysis showed 94.8% product and 4.0% presumed double HFIBO adduct. The acidified aqueous phase was extracted with 2×200 ml dichloromethane. The dichloromethane extracts were washed with 400 ml brine to pH 5, then dried over sodium sulfate, filtered and rotary evaporated to give only 3.3 g additional material. GC analysis showed its composition to be identical to the bulk (185 g) sample. The 185-gram sample was dissolved in 200 ml toluene and treated with 200 ml 25% aqueous KOH. The resulting milky suspension was exhaustively rotary evaporated to give a yellow oil. This oil could not be crystallized or solidified. The oil was dissolved in 200 ml heptane and was acidified with 90 ml concentrated HCl.

The aqueous phase was removed and the heptane portion was then treated portion-wise with 25% aqueous sodium hydroxide until a small aqueous NaOH phase separated. A total of 110 ml 25% aqueous sodium hydroxide was added. The small aqueous phase was removed and the remaining heptane phase was rotary evaporated to a yellow oil. This was chilled in a methanol/ice bath, leading to solidification of the NaNBBMHFP as a wax. The wax (18 g) was slurried in 20 ml heptane and then heated to dissolve. The resulting hazy mixture was allowed to sit, allowing water to settle out and clarifying the heptane phase. The water was removed and then the heptane solution was cooled in methanol-ice to induce crystallization. The resulting crystals were slurried in 40 ml heptane, filtered, and washed with heptane to give a solid analyzing as 98.6% product and 0.5% presumed double HFIBO adduct. The remaining 218.60 g of NaNBBMHFP wax was dissolved in 200 ml hot heptane. The mixture was allowed to sit and to let residual water separate. The water phase was removed and the remaining solution was chilled in a methanol-ice bath to induce crystallization. The solid was mixed with 300 ml heptane, filtered, and washed with heptane. This gave material with 98.0% purity and 0.7% double HFIBO adduct. The pilot and bulk crystal crops were combined to give 268 g. This was dissolved in 300 ml hot heptane, chilled in a methanol-ice bath to induce crystallization, and then agitated to induce crystallization of fine crystals. The crystals were diluted with 200 ml heptane to produce a slurry, then filtered, and washed with heptane. This yielded 233 g with 98.8% purity. These crystals were again recrystallized from 300 ml hot heptane in the manner just described, giving again 98.8% purity material. The crystals were dispersed in 300 ml deionized water, resulting in a hazy, murky solution due to residual heptane. The NaNBBMHFP solution was diluted further with 200 ml water. The solution was acidified to pH<2 with 50 ml concentrated HCl. The phases were separated. The upper organic phase was washed with 100 ml brine to pH 6. This was dried over sodium sulfate, filtered, and rotary evaporated to give 137 g (72% yield) hazy liquid with suspended solids. This was diluted with dichloromethane and washed with 2×100 ml 3.5 N HCl. The organic phase was then washed with 100 ml and 2×200 ml brine to pH 6. The organic solution was dried over sodium sulfate, filtered, and rotary evaporated to give 139.5 g clear, yellow liquid, GC analysis showed 99.0% purity. The material was vacuum distilled to yield 126.8 g (76% yield) endo/exo-NBBMHFP at >98.5% purity.

Monomer Synthesis Example S-6

Synthesis of GlyMHFPNB (M8)

Into a dry 1 L round bottom flask equipped with a magnetic stirrer, a cooling condenser and an addition funnel was added 400 mL of dry tetrahydrofuran, 7.8 g (0.32 moles) of sodium hydride and 46 g (0.27 moles) of 2-(bicyclo[2.2.1]hept-5-en-2-ylmethoxy)ethanol (NBGlyOH). The reaction mixture was heated to 50° C. and was stirred overnight in nitrogen atmosphere and cooled in dry-ice. To this mixture was added via the addition funnel 63 g (0.35 moles) of 1,1,1,3,3,3-hexafluoro ethylene oxide (HFIBO) and the reaction mixture was allowed to warm to ambient temperature and stirred for 3.5 hours. The resulting solution was treated with 150 g of 20% sulfuric acid solution followed by 3 extractions with 150 g of deionized water. The solution was concentrated by rotary evaporation to obtain 80 g of the final product characterized by $^1$H NMR spectroscopy.

Monomer Synthesis Example S-7

Synthesis of MM(MMHFP)2NB (M10)

Into a dry 120 mL reaction vessel equipped with a magnetic stirrer was added 10 mL of dry tetrahydrofuran and 1.56 g (0.065 moles) of sodium hydride in a dry box. To this suspension was added 5.0 g (0.027 moles) of 2-(bicyclo[2.2.1]hept-5-en-2-ylmethyl)propane-1,3-diol (MM(MOH)$_2$NB) dissolved in 20 mL of anhydrous tetrahydrofuran. The vessel was sealed after the gas evolution ceased. The reaction mixture was heated to 40° C. while venting any gas evolved through a syringe needle and stirred for 15 hrs. The mixture was cooled in an ice/water bath. To this mixture was added, via syringe transfer, 12.6 g (0.0.068 moles) of 1,1,1,3,3-hexafluoro ethylene oxide (HFIBO). The reaction mixture was allowed to warm to ambient temperature and stirred for 20 hours. The resulting solution was treated with 75 g of 30% sulfuric acid solution followed by 2 extractions with 100 mL of deionized water. The organic phase was concentrated by rotary evaporation to remove the solvents to obtain 13 g of the final product characterized by $^1$H NMR spectroscopy.

Polymer Synthesis Examples

Polymer Synthesis Examples P-1(a-c)

Polymerization of HFANB (M2)

A reaction vessel was charged with HFANB, toluene and ethyl acetate and sparged with nitrogen. This vessel was sealed and placed in a dry box. Solid Pd-1206 and DANFABA were added to the mixture. The vessel was sealed and taken out of the dry box. A desired amount of formic acid, sparged with nitrogen, based on the mole percent of the monomer was added. The mixture was then heated to the desired temperature (100° C. for 1a and 110° C. for 1b and 1c) with stirring for 17 hours. Catalyst and monomer were removed from the reaction mixture and the polymer was obtained as dry powder. GPC analysis of the polymer solution in tetrahydrofuran was performed to determine the molecular weight (Table P-1).

In each of the tables below, where presented, the value for monomers is in grams, mole (g, mol), the value for Pd-1206 is in grams, millimole (g, mmol), the value for DANFABA is in (g, mmol), the values for toluene (Tol.) and ethyl acetate (EA) is in (g), the value for formic acid (FA) is in (mol %) and the value for yield is in (%).

TABLE P-1

| Ex. | M2 | Pd-1206 | DANFABA | Tol. | EA | FA | Yield | Mw | PDI |
|---|---|---|---|---|---|---|---|---|---|
| 1a | 11.0, 0.040 | 0.024, 0.020 | 0.048, 0.060 | 11.4 | 3.81 | 1 | 61 | 21,919 | 2.45 |
| 1b | 8.22, 0.030 | 0.018, 0.015 | 0.036, 0.045 | 8.93 | 2.98 | 10 | 45 | 4,558 | 1.72 |
| 1c | 8.22, 0.030 | 0.018, 0.015 | 0.036, 0.045 | 8.93 | 2.98 | 20 | 38 | 3,660 | 1.66 |

Polymer Synthesis Examples P-2(a-c)

Polymerization of TFSNB (M1)

A reaction vessel was charged with TFSNB, toluene and ethyl acetate and sparged with nitrogen. This vessel was sealed and placed in a dry box. Solid Pd-1206 and DANFABA were added to the mixture. The vessel was taken out of the dry box and a desired amount of formic acid, sparged with nitrogen, based on the mole percent of the monomer was added. The solution was heated to the desired temperature (100°C for example 3a and 110° C. for examples 3b and 3c) with stirring for 17 hours. Catalyst and monomer were removed from the mixture and the polymer was obtained as dry powder. GPC analysis of polymer solution in tetrahydrofuran was performed to determine the molecular weight (Table P-2).

TABLE P-2

| Ex. | M1 | Pd-1206 | DANFABA | Tol. | EA | FA | Yield | Mw | PDI |
|---|---|---|---|---|---|---|---|---|---|
| 2a | 10.2, 0.040 | 0.024, 0.020 | 0.048, 0.060 | 11.4 | 3.81 | 1 | 89 | 16,824 | 2.40 |
| 2b | 7.66, 0.030 | 0.018, 0.015 | 0.036, 0.045 | 8.47 | 2.82 | 10 | 59 | 2,860 | 1.43 |
| 2c | 7.66, 0.030 | 0.018, 0.015 | 0.036, 0.045 | 8.47 | 2.82 | 20 | 46 | 2,121 | 1.31 |

Polymer Synthesis Example P-3

Polymerization of TFSEtNB (M3)

A reaction vessel was charged with TFSEtNB, toluene and ethyl acetate and with nitrogen. This vessel was sealed and placed in a dry box. Solid Pd-1206 and DANFABA were added. The vessel was taken out of the dry box and a desired amount of formic acid, sparged with nitrogen, based on the mole percent of the monomer was added. The solution was heated to 100° C. with stirring for 17 hours. Catalyst and monomer were removed from the reaction mixture and the polymer was obtained as dry powder. GPC analysis of polymer solution in tetrahydrofuran was performed to determine the molecular weight (Table P-3). The PDI was determined to be 1.68.

TABLE P-3

| Ex. | M3 | Pd-1206 | DANFABA | Tol. | EA | FA | Yield | Mw |
|---|---|---|---|---|---|---|---|---|
| 3 | 8.07, 0.030 | 0.018, 0.015 | 0.036, 0.045 | 8.93 | 2.98 | 20 | 32 | 4,472 |

Polymer Synthesis Examples P-4(a-b)

Polymerization of MMHFPNB (M5)

A reaction vessel was charged with MMHFPNB, toluene and ethyl acetate and sparged with nitrogen. This vessel was sealed and placed in a dry box. DANFABA was added to the vessel and the vessel was taken out of the dry box and a desired amount of formic acid, sparged with nitrogen based on the mole percent of the monomer, was added to the vessel. A Pd-1206 solution (2 weight percent) was made separately in ethyl acetate in a crimp cap vial and sealed in the dry box. The reaction vessel was heated to 100° C. The Pd-1206 solution was added to the heated reaction mixture and stirred for 17 hours for example 5a and 20 hours for example 5b. Catalyst and monomer were removed from the reaction mixture and the polymer was obtained as dry powder. GPC analysis of the polymer solution in tetrahydrofuran was performed to determine the molecular weight (Table P-4).

TABLE P-4

| Ex. | M5 | Pd-1206 | DANFABA | Tol. | EA | FA | Yield | Mw | PDI |
|---|---|---|---|---|---|---|---|---|---|
| 4a | 6.06, 0.020 | 0.024, 0.020 | 0.096, 0.120 | 6.74 | 2.24 | 4 | 64 | 13,841 | 2.81 |
| 4b | 39.5, 0.130 | 0.157, 0.130 | 0.312, 0.390 | 43.2 | 15.5 | 20 | 76 | 5,247 | 1.89 |

Polymer Synthesis Examples P-5(a-b)

Polymerization of MMHFPNB (M5)

A reaction vessel was charged with MMHFPNB, formic acid, DANFABA, toluene and ethyl acetate. In a dry box, Pd-1206 solution (2 weight percent) was made in ethyl acetate in a crimp cap vial and sealed. The solution in the reactor was heated to 100° C. under a nitrogen blanket, Pd-1206 solutions in ethyl acetate was added to the heated reaction mixture via a pressure cylinder and stirred for the desired duration lasting 16 to 17 hours, Catalyst and monomer were removed from the reaction mixture and the polymer was obtained as a solution in 4-methylpentan-2-ol. GPC analysis was performed to determine the molecular weight of the polymer (Table P-5). The PDI for Examples 4a and 4b was determined to be 1.49.

TABLE P-5

| Ex. | M5 | Pd-1206 | DANFABA | Tol. | EA | FA | Yield | Mw |
|---|---|---|---|---|---|---|---|---|
| P-5a | 494, 1.63 | 1.96, 1.63 | 3.90, 4.87 | 540 | 180 | 20 | 73 | 3,673 |
| P-5b | 1,201, 3.95 | 4.76, 3.90 | 9.489, 11.80 | 1,313 | 438 | 20 | 74 | 3,545 |

Polymer Examples P-6(A-E)

Polymerization of EMHFPNB (M6)

A reaction vessel was charged with EMHFPNB, toluene and ethyl acetate and sparged with nitrogen. The vessel was sealed and placed in a dry box. Solid Pd-1206 and DANFABA were added to the reaction vessel in examples 7a, 7c, 7d and 7e, sealed and taken out of the dry box. In the case of example 7b, DANFABA was added to the reaction vessel and taken out of the dry box. Pd-1206 solution (2 weight percent) was made separately in ethyl acetate in a crimp cap vial and sealed in the dry box to be used in examples 7b. The desired amount of formic acid, sparged with nitrogen, based on the mole percent of the monomer was added to the reaction vessel. The mixture was heated to 100° C. The Pd-1206 solution in ethyl acetate was added to the heated reaction mixture in example 7b. The reaction mixture was stirred for about an overnight duration lasting 17 to 20 hours. Catalyst and monomer were removed from the reaction mixture and the polymer was obtained as a dry powder. GPC analysis of the polymer solution in tetrahydrofuran was performed to determine the molecular weight (Table P-6).

TABLE P-6

| Ex. | M6 | Pd-1206 | DANFABA | Tol. | EA | FA | Yield | Mw | PDI |
|---|---|---|---|---|---|---|---|---|---|
| 6a | 16.7, 0.05 | 0.064, 0.01 | 0.127, 0.16 | 17.9 | 5.97 | 40 | 85 | 28,656 | 3.61 |
| 6b | 6.36, 0.02 | 0.024, 0.02 | 0.096, 0.12 | 7.03 | 2.34 | 5 | 61 | 18,321 | 2.94 |
| 6c | 41.3, 0.13 | 0.157, 0.13 | 0.312, 0.39 | 44.8 | 14.9 | 30 | 85 | 11,106 | 2.63 |
| 6d | 4.73, 0.02 | 0.018, 0.002 | 0.036, 0.05 | 5.15 | 1.72 | 30 | 59 | 4,504 | 1.85 |
| 6e | 4.73, 0.02 | 0.018, 0.002 | 0.036, 0.05 | 5.15 | 1.72 | 35 | 68 | 3,391 | 1.54 |

Polymer Synthesis Examples P-7(a-b)

Polymerization of EMHFPNB (M6)

A suitably sized reactor was charged with EMHFPNB, formic acid, DANFABA, toluene and ethyl acetate. In a dry box, Pd-1206 solution (2 weight percent) was made in ethyl acetate in a crimp cap vial and sealed. The solution in the reactor was heated to 100° C. under a nitrogen atmosphere and the Pd-1206 solution in ethyl acetate was added to the heated reaction mixture via a pressure cylinder. The reaction mixture was stirred for the desired duration lasting 16 to 17 hours, Catalyst and monomer were removed from the reaction mixture and the polymer was obtained as a solution in 4-methylpentan-2-ol. GPC analysis was performed to determine the molecular weight of the polymer (Table P-7).

TABLE P-7

| Ex. | M6 | Pd-1206 | DANFABA | Tol. | EA | FA | Yield | Mw | PDI |
|---|---|---|---|---|---|---|---|---|---|
| 7a | 410, 1.29 | 1.56, 1.29 | 3.09, 3.87 | 445 | 147 | 30 | 79 | 7,672 | 1.87 |
| 7b | 1,199, 3.77 | 4.55, 3.80 | 9.06, 11.30 | 1,305 | 435 | 26 | 62 | 7,645 | 1.91 |

Polymer Synthesis Examples P-8(a-d)

Polymerization of BMHFPNB (M7)

A reaction vessel was charged with BMHFPNB, toluene and ethyl acetate and sparged with nitrogen. The vessel was sealed and placed in a dry box. DANFABA was added to the reaction vessel. The vessel was sealed and taken out of the dry box. A Pd-1206 solution (2 weight percent) was made in ethyl acetate in a separate crimp cap vial and sealed in the dry box. The desired amount of formic acid, sparged with nitrogen, based on the mole percent of the monomer was added to the reaction vessel and heated to 100° C. The Pd-1.206 solution in ethyl acetate was added to the heated vessel and stirred for 17 hours (18 hours for example 8c). Catalyst and monomer were removed from the reaction mixture and the polymer was obtained as dry powder; GPC analysis of the polymer solution in tetrahydrofuran was performed to determine the molecular weight (Table P-8).

TABLE P-8

| Ex. | M7 | Pd-1206 | DANFABA | Tol. | EA | FA | Yield | Mw | PDI |
|---|---|---|---|---|---|---|---|---|---|
| 8a | 6.92, 0.02 | 0.02, 0.02 | 0.10, 0.12 | 7.63 | 2.54 | 10 | 45 | 33,872 | 3.75 |
| 8b | 6.92, 0.02 | 0.02, 0.02 | 0.10, 0.12 | 7.63 | 2.54 | 20 | 58 | 25,128 | 3.29 |
| 8c | 30.1, 0.09 | 0.11, 0.09 | 0.21, 0.26 | 51.6 | 13.8 | 0.3 | 66 | 19,699 | 2.34 |
| 8d | 6.92, 0.02 | 0.02, 0.02 | 0.10, 0.12 | 7.63 | 2.54 | 40 | 55 | 15,895 | 2.61 |

Polymer Synthesis Example P-9

Polymerization of BMHFPNB (M17)

A suitably sized reactor was charged with EMHFPNB, formic acid, DANFABA, toluene and ethyl acetate. In a dry box, Pd-1206 solution (2 weight percent) was made in ethyl acetate in a crimp cap vial and sealed. The solution in the reactor was heated to 100° C. under a nitrogen blanket. The Pd-1206 solution in ethyl acetate was added to the heated reaction mixture via a pressure cylinder. The mixture was stirred for 18 hours. Catalyst and monomer were removed from the reaction mixture and the polymer was obtained as a dry powder. GPC analysis was performed to determine the molecular weight of the polymer (Table P-9),

TABLE P-9

| Ex. | M7 | Pd-1206 | DANFABA | Tol. | EA | FA | Yield | $M_w$ | PDI |
|---|---|---|---|---|---|---|---|---|---|
| 9 | 260, 0.75 | 0.91, 0.75 | 1.80, 2.25 | 445 | 148 | 30 | 63 | 21,470 | 2.59 |

Polymer Synthesis Examples P-10(a-c)

Polymerization of GlyMHFPNB (M8)

A reaction vessel was charged with GlyMHFPNB, toluene and ethyl acetate and sparged with nitrogen. This vessel was sealed and placed in a dry box. Solid Pd-1206 and DANFABA were added. The vessel was taken out of the dry box and a desired amount of formic acid, sparged with nitrogen, based on the mole percent of the monomer was added. The mixture was heated to 100° C. and stirred for 17 hours. Catalyst and monomer were removed from the reaction mixture and the polymer was obtained as a dry powder. GPC analysis of the polymer as a solution in tetrahydrofuran was performed to determine the molecular weight (Table P-10),

TABLE P-10

| Ex. | M8 | Pd-120 | DANFABA | Tol. | EA | FA | Yield | $M_w$ | PDI |
|---|---|---|---|---|---|---|---|---|---|
| 10a | 10.44, 0.03 | 0.02, 0.02 | 0.04, 0.05 | 11.7 | 3.89 | 3 | 89 | 31,820 | 4.55 |
| 10b | 10.44, 0.03 | 0.02, 0.02 | 0.04, 0.05 | 11.6 | 3.87 | 10 | 49 | 16,011 | 3.27 |
| 10c | 10.44, 0.03 | 0.02, 0.02 | 0.04, 0.05 | 11.6 | 3.87 | 20 | 58 | 12,084 | 2.89 |

Polymer Synthesis Examples 11(a-b)

Polymerization of GlyMHFPNB (M8)

A suitably sized reactor was charged with GlyMHFPNB, formic acid, DANFABA, toluene and ethyl acetate. In a dry box, Pd-1206 solution (2 weight percent) was made in ethyl acetate in a crimp cap vial and sealed. The solution in the reactor was heated to 100° C. under a nitrogen blanket. The Pd-1206 solution in ethyl acetate was added to the heated reaction mixture via a pressure cylinder and stirred for 16 hours for example 11a and 18 hours, for example 11b. Catalyst and monomer were removed from the reaction mixture and the polymer was obtained as a dry powder. GPC analysis was performed to determine the molecular weight of the polymer (Table P-11).

TABLE P-11

| Ex. | M8 | Pd-1206 | DANFABA | Tol. | EA | FA | Yield | Mw | PDI |
|---|---|---|---|---|---|---|---|---|---|
| 11a | 125, 0.36 | 0.43, 0.36 | 0.87, 1.08 | 136 | 45 | 30 | 75 | 9,950 | 2.32 |
| 11b | 125, 0.36 | 0.43, 0.36 | 0.87, 1.08 | 277 | 93 | 30 | 78 | 6,580 | 2.03 |

Polymer Synthesis Examples P-12(a-c)

Polymerization of MMHFPNB (M5) and FPCNB (M4)

A reaction vessel was charged with MMHFPNB, FPCNB, toluene and ethyl acetate and sparged with nitrogen. The vessel was sealed and placed in a dry box. Pd-1206 and DANFABA were added to the vessel. The vessel was taken out of the dry box and the desired amount of formic acid, sparged with nitrogen, based on the mole percent of the monomer, was added. The solution was heated to 100° C. and stirred for 22 hours. Catalyst and monomer were removed from the reaction mixture and the polymer was obtained as dry powder. $^1$H-NMR spectroscopy was used to determine the composition of the polymer. GPC analysis of the polymer as a solution in tetrahydrofuran was performed to determine the molecular weight (Table P-12).

TABLE P-12

| Ex. | M5 | M11 | Pd-1206 | DANFABA | Tol. | EA | FA | Yield | Mw | PDI |
|---|---|---|---|---|---|---|---|---|---|---|
| 12a | 7.78, 0.03 | 1.73, 0.01 | 0.04, 0.03 | 0.08, 0.10 | 10.5 | 3.5 | 10 | 71 | 5,795 | 1.78 |
| 12b | 7.45, 0.03 | 2.84, 0.01 | 0.04, 0.04 | 0.08, 0.11 | 11.4 | 3.79 | 10 | 63 | 4,775 | 1.63 |
| 12c | 7.45, 0.03 | 2.84, 0.01 | 0.04, 0.04 | 0.08, 0.11 | 11.3 | 3.76 | 15 | 83 | 3,434 | 1.51 |

Polymer Synthesis Examples 13(A-C)

Polymerization of EMHFPNB (M6) and FPCNB (M4)

A reaction vessel was charged with EMHFPNB, FPCNB, toluene and ethyl acetate and sparged with nitrogen. The vessel was sealed and placed in a dry box. Solid Pd-1206 and DANFABA were added. The vessel was taken out of the dry box and a desired amount of formic acid, sparged with nitrogen, based on the mole percent of the monomer, was added. The solution was heated to 100° C. with stirring for 22 hours. Catalyst and monomer were removed from the reaction mixture and the polymer was obtained as a dry powder. $^1$H-NMR spectroscopy was used to determine the composition of the polymer. GPC analysis of polymer as a solution in tetrahydrofuran was performed to determine the molecular weight (Table P-13).

TABLE P-13

| Ex. | M6 | M4 | Pd-1206 | DANFABA | Tol. | EA | FA | Yield | $M_w$ | PDI |
|---|---|---|---|---|---|---|---|---|---|---|
| 13a | 10.18, 0.03 | 2.16, 0.01 | 0.048, 0.04 | 0.10, 0.12 | 13.6 | 4.5 | 10 | 76 | 11,917 | 2.62 |
| 13b | 8.90, 0.03 | 3.24, 0.01 | 0.048, 0.04 | 0.10, 0.12 | 13.4 | 4.5 | 10 | 76 | 8,551 | 2.24 |
| 13c | 8.90, 0.03 | 3.24, 0.01 | 0.084, 0.04 | 0.10, 0.12 | 13.4 | 4.5 | 15 | 69 | 7,683 | 2.10 |

Polymer Synthesis Examples P-14(a-c)

Polymerization of GlyMHFPNB (M8) and FPCNB (M4)

A reaction vessel was charged with GlyMHFPNB, FPCNB, toluene and ethyl acetate and sparged with nitrogen. The vessel was sealed and placed in a dry box. Solid Pd-1206 and DANFABA were added to the vessel. The vessel was taken out of the dry box and a desired amount of formic acid, sparged with nitrogen, based on the mole percent of the monomer, was added. The solution was heated to 100° C. with stirring for 17 hours. Catalyst and monomer were removed from the reaction mixture and the polymer was obtained as dry powder. GPC analysis of polymer as a solution in tetrahydrofuran was performed to determine the molecular weight (Table P-14).

The reaction mixture was stirred for the desired duration lasting 4 to 5 hours. The polymerization reaction was carried out twice and the two reaction mixtures were combined. Catalyst and residual monomer were removed from the reaction mixture.

Yield was determined based on the solid polymer content in the purified polymer solution using a Mettler Toledo Halo-

TABLE P-14

| Ex. | M8 | M4 | Pd-1206 | DANFABA | Tol. | EA | FA | Yield | Mw | PDI |
|---|---|---|---|---|---|---|---|---|---|---|
| 14a | 6.25, 0.018 | 0.540, 0.002 | 0.02, 0.02 | 0.05, 0.06 | 7.39 | 2.46 | 30 | 84 | 8,905 | 2.55 |
| 14b | 5.57, 0.016 | 1.08, 0.004 | 0.02, 0.02 | 0.05, 0.06 | 7.22 | 2.41 | 30 | 66 | 7,786 | 2.54 |
| 14c | 13.4, 0.039 | 3.11, 0.012 | 0.03, 0.03 | 0.06, 0.08 | 18.0 | 6.0 | 30 | 82 | 8,700 | 2.42 |

Polymer Synthesis Example P-15

Polymerization of MMHFPNB (M5) and FPCNB (M4) Using Controlled Addition of One Monomer A suitably sized reactor was charged with FPCNB, formic acid, DANFABA, toluene, ethyl acetate and a portion (79.3 weight percent) of the total MMHFPNB (see Table P-15 below for exact amounts). The remaining (20.7 weight percent) MMHFPNB is charged to a syringe pump which is connected to the reactor. In a dry box, Pd-1206 solid was added to a pressure cylinder. Anhydrous ethyl acetate was airlessly added to the pressure cylinder resulting in a 7 weight percent Pd-1206 solution. The solution in the reactor was heated to 100° C. under a nitrogen atmosphere and the Pd-1206 solution in ethyl acetate was transferred to the heated reaction mixture. Following catalyst injection the syringe pump containing MMHFPNB was started and monomer was added to the reactor according to a predetermined schedule: 3.208 g/min for the first 8 min, 3.228 g/min for the next 16 min, 2.544 g/min for the next 11 min, 2.044 g/min for the next 14 min, 0.980 g/min for the next 33 min, and 0.324 g/min for the next 102 min.

The predetermined schedules for the polymerizations where monomers were added to the reaction vessels in a controlled manner were determined as follows. The polymerizations were first carried out in one batch without controlled addition while monitoring the consumption of each monomer by withdrawing samples from the reaction vessels at time intervals. The amounts of unreacted monomers in the samples were determined by gas chromatography analysis. The reactivity of the two monomers with respect to each other was calculated based on these analyses. A controlled addition schedule of the more reactive monomer was estimated and a second polymerization with controlled addition of portions of one or both monomers was carried out according to this schedule. The consumption of each monomer was determined at time intervals for this second polymerization. The controlled addition schedule was optimized until both monomers were consumed by polymerization at a comparable rate.

gen Moisture Analyzer. $^{19}$F-NMR spectroscopy was used to determine the composition of the polymer. GPC analysis was performed to determine the molecular weight of the polymer. Water contact angle, sliding angle and dissolution rate of thin films of the polymer in 0.26N TMAH were determined (Table P-15).

TABLE P-15

| Ex. | M5 | M4 | Pd1206 | DANFABA | Tol. | EA | FA | Yield | $M_w$ | PDI |
|---|---|---|---|---|---|---|---|---|---|---|
| P-15 | 1,856, 6.4 | 431, 1.6 | 9.7, 0.008 | 19.2, 0.024 | 2,538 | 846 | 25.6, 0.06 | 83 | 4,710 | 1.50 |

Polymer Synthesis Examples P-16 (a-c)

Polymerization of GlyMHFPNB (M8) and NBC4F9 (M13)

A reaction vessel was charged with a portion (17.5 weight percent) of the total GlyMHFPNB, NBC$_4$F$_9$, toluene and ethyl acetate and sparged with nitrogen. The vessel was sealed and placed in a dry box and DANFABA (0.02 g, 0.2 mmol) was added to the vessel. The remaining (82.5 weight percent) GlyMHFPNB is charged to a syringe pump which is connected to the reactor. In a separate vessel the desired amount of Pd-1206 (0.08 g, 0.07 mmol) was mixed with ethyl acetate to make 1 weight percent solution of Pd-1206 and sealed. To the first vessel was added the desired amount of formic acid, sparged with nitrogen, based on the mole percent of the monomer. The solution was heated to 100° C. and the Pd-1.206 catalyst in ethyl acetate was transferred to the reaction vessel using a syringe. Following catalyst injection the syringe pump containing GlyMHFPNB was started and monomer was added to the reactor according to a predetermined schedule:

16a: 0.244 g/min for the first 31 min, 0.172 g/min for the next 75 min, 0.137 g/min for the next 130 min, 0.098 g/min for the next 207 min, 0.069 g/min for the next 316 min, 0.057 g/min for the next 447 min and 0.049 g/min for the next 601 min.

16b: 0.15 g/min for the first 30 min, 0.120 g/min for the next 80 min, 0.110 g/min for the next 150 min, 0.090 g/min for the next 240 min, 0.070 g/min for the next 350 min, 0.060 g/min for the next 470 min and 0.040 g/min for the next 600 min.

16c: 0.15 g/min for the first 30 min, 0.110 g/min for the next 80 min, 0.080 g/min for the next 150 min, 0.060 g/min for the next 240 min, 0.040 g/min for the next 350 min, 0.030 g/min for the next 470 min and 0.020 g/min for the next 610 min.

The reaction mixture was cooled to ambient temperature after the contents of the reaction vessel were kept at 100° C. for total of 20 hours. Catalyst and residual monomer were removed from the reaction mixture and the polymer was obtained as dry powder. $^{19}$F-NMR spectroscopy was used to determine the composition of the polymer. GPC analysis was performed to determine the molecular weight of the polymer (Table P-16).

TABLE P-16

| Ex. | M8 | M13 | Tol. | EA | FA | Yield | $M_w$ | PDI |
|---|---|---|---|---|---|---|---|---|
| 16a | 55.7, 0.16 | 12.5, 0.04 | 91.8 | 30.8 | 30 | 84 | 2,831 | 1.23 |
| 16b | 55.7, 0.16 | 12.3, 0.04 | " | " | " | 54 | 3,218 | 1.25 |
| 16c | 45.24, 0.13 | 21.8, 0.07 | 92.0 | 30.7 | 15 | " | 2,902 | 1.25 |

Polymer Synthesis Examples P-17 (a-c)

Polymerization of GlyMHFPNB (M8) and FHCNB (M11)

A suitably sized reaction bottle was charged with GlyMH-FPNB, FHCNB, formic acid, DANFABA (0.08 g, 0.11 mmol), toluene, and ethyl acetate. In a dry box, Pd-1206 (0.04 g, 0.04 mmol) solid was added to a septum bottle. Anhydrous ethyl acetate was added using a syringe to the septum bottle resulting in a 1 weight percent Pd-1206 solution. The solution in the reactor was heated to 110° C. under a nitrogen atmosphere and the Pd-1206 solution in ethyl acetate was transferred to the heated reaction mixture. The reaction mixture was stirred for the desired duration lasting 16 to 17 hours. The percent conversion of the monomers to polymer was determined based on the solid polymer content in the reaction mixture using a Mettler Toledo Halogen Moisture Analyzer. Catalyst and residual monomer were removed from the reaction mixture. H-NMR spectroscopy was used to determine the composition of the polymer. GPC analysis was performed to determine the molecular weight of the polymer (Table P-17)

TABLE P-17

| Ex. | M8 | M11 | Tol. | EA | FA | Yield | $M_w$ | PDI |
|---|---|---|---|---|---|---|---|---|
| 17a | 21.9, 0.06 | 2.69, 0.007 | 27.0 | 9.0 | 30 | 100 | 7,790 | 2.02 |
| 17b | 20.7, 0.06 | 4.03, 0.01 | " | " | " | " | 7,330 | 1.94 |
| 17c | 19.5, 0.06 | 5.38, 0.014 | " | " | " | " | 6,920 | 1.86 |

Polymer Synthesis Example P-18. Polymerization of GlyMHFPNB ((M8) and FOHCNB (M12)

A suitably sized reaction bottle was charged with GlyMH-FPNB, FOHCNB, formic acid, DANFABA (0.08 g, 011 mmol), toluene, and ethyl acetate. In a dry box, Pd-1206 (0.04 g, 0.04 mmol) solid was added to a septum bottle. Anhydrous ethyl acetate was added using a syringe to the septum bottle resulting in a 1 weight percent Pd-1206 solution. The solution in the reactor was heated to 110° C. under a nitrogen atmosphere and the Pd-1206 solution in ethyl acetate was transferred to the heated reaction mixture. The reaction mixture was stirred for the desired duration lasting 16 to 17 hours. The percent conversion of the monomers to polymer was determined based on the solid polymer content in the reaction mixture using a Mettler Toledo Halogen Moisture Analyzer. Catalyst and residual monomer were removed from the reaction mixture. Catalyst and residual monomer were removed from the reaction mixture, H-NMR spectroscopy was used to determine the composition of the polymer. GPC analysis was performed to determine the molecular weight of the polymer. (Table P-18).

TABLE P-18

| Ex. | M10 | M11 | Tol. | EA | FA | Yield | $M_w$ | PDI |
|---|---|---|---|---|---|---|---|---|
| 18a | 21.9, 0.06 | 2.47, 0.007 | 27.0 | 9.0 | 30 | 100 | 12,070 | 2.71 |
| 18b | 20.8, 0.06 | 3.70, 0.011 | " | " | " | " | 7,980 | 2.14 |
| 18c | 19.5, 0.06 | 4.93, 0.014 | " | " | " | " | 7,300 | 2.01 |

Polymer Synthesis Example P-19

Polymerization of MM(MMHFP)$_2$NB (M10) and FHCNB (M11)

A reaction vessel was charged with MM(MMHFP)$_2$NB, FHCNB, toluene and ethyl acetate and sparged with nitrogen. The vessel was sealed and placed in a dry box. Pd-1206 (0.02 g, 0.01 mmol) and DANFABA (0.03 g, 0.04 mmol) were added to the vessel. The vessel was taken out of the dry box and the desired amount of formic acid, sparged with nitrogen, based on the mole percent of the monomer, was added. The solution was heated to 100° C. and stirred for 16 hours. Catalyst and monomer were removed from the reaction mixture and the polymer was obtained as dry powder. $^{19}$F-NMR spectroscopy was used to determine the composition of the polymer. GPC analysis of the polymer as a solution in tetrahydrofuran was performed to determine the molecular weight (Table P-19).

TABLE P-19

| Ex. | M10 | M11 | Tol. | EA | FA | Yield | $M_w$ | PDI |
|---|---|---|---|---|---|---|---|---|
| 19 | 3.65, .01 | 1.00, 0.003 | 5.1 | 1.7 | 20 | 54 | 5,334 | 1.23 |

Polymer Synthesis Example P-20 (A-B)

Polymerization of MMHFPNB (M5) and NBC4F9 (M13)

A reaction vessel was charged with a portion (30 weight percent) of the total MMHFPNB, a portion of the total NBC$_4$F$_9$, toluene and ethyl acetate and sparged with nitrogen. The vessel was sealed and placed in a dry box and DANFABA was added to the vessel. The remaining (70 weight percent) MMHFPNB is charged to a syringe pump which is connected to the reactor. In a separate vessel the desired amount of Pd-1206 was mixed with ethyl acetate to make 1 weight percent solution of Pd-1206 and sealed. To the first vessel was added the desired amount of formic acid, sparged with nitrogen, based on the mole percent of the monomer. The solution was heated to 100° C. and the Pd-1206 catalyst in ethyl acetate was transferred to the reaction vessel using a syringe. Following catalyst injection the syringe pump containing MMHFPNB was started and monomer was added to the reactor according to a predetermined schedule:

20a: 0.140 g/min for the first 30 min, 0.130 g/min for the next 75 min, 0.110 g/min for the next 135 min, 0.070 g/min for the next 225 min, 0.040 g/min for the next 335 min, 0.030 g/min for the next 447 min and 0.049 g/min for the next 601 min.

20b: 0.15 g/min for the first 30 min, 0.120 g/min for the next 80 min, 0.110 g/min for the next 150 min, 0.090 g/min for the next 240 min, 0.070 g/min for the next 350 min, 0.060 g/min for the next 465 min and 0.020 g/min for the next 605 min.

The reaction mixture was cooled to ambient temperature after the contents of the reaction vessel were kept at 100° C. for 20 hours. Catalyst and residual monomer were removed from the reaction mixture and the polymer was obtained as dry powder. $^{19}$F-NMR spectroscopy was used to determine the composition of the polymer. GPC analysis was performed to determine the molecular weight of the polymer (Table P-20).

TABLE P-20

| Ex. | M5 | M13 | Pd-1206 | DANFABA | Tol. | EA | FA | Yield | $M_w$ | PDI |
|---|---|---|---|---|---|---|---|---|---|---|
| 20a | 48.6, 0.16 | 12.5, 0.04 | 0.10, 0.08 | 0.02, 0.24 | 82.6 | 27.5 | 25 | 58 | 1,933 | 1.11 |
| 20b | 42.6, 0.14 | 18.7, 0.06 | 0.08, 0.07 | 0.02, 0.20 | 83.4 | 27.8 | 20 | 60 | 2,079 | 1.18 |

Polymer Synthesis Example P-21 (A-B)

Polymerization of GlyMHFPNB (M8) and BuNB (M14)

A reaction vessel was charged with GlyMHFPNB, a portion of the total BuNB (72 weight percent for 21a and 86 weight percent for 21b), toluene and ethyl acetate and sparged with nitrogen. The vessel was sealed and placed in a dry box and DANFABA was added to the vessel. The remaining BuNB (28 weight percent for 21a and 14 weight percent for 21b) is charged to a syringe pump which is connected to the reactor. In a separate vessel the desired amount of Pd-1206 was mixed with ethyl acetate to make 1 weight percent solution of Pd-1206 and sealed. To the first vessel was added the desired amount of formic acid, sparged with nitrogen, based on the mole percent of the monomer. The solution was heated to 110° C., and the Pd-1206 catalyst in ethyl acetate was transferred to the reaction vessel using a syringe. Following catalyst injection the syringe pump containing BuNB was started and monomer was added to the reactor according to a predetermined schedule:

21a: 0.188 g/min for the first 4 min, 0.125 g/min for the next 26 min, 0.083 g/min for the next 25 min, 0.075 g/min for the next 35 min, 0.025 g/min for the next 65 min and 0.002 g/min for the next 500 min.

21b: 0.547 g/min for the first 4 min, 0.282 g/min for the next 10 min, 0.263 g/min for the next 16 min, 0.160 g/min for the next 25 min, 0.094 g/min for the next 35 min, 0.031 g/min for the next 65 min and 0.002 g/min for the next 500 min.

The reaction mixture was cooled to ambient temperature after the contents of the reaction vessel were kept at 100° C. for 20 hours. Catalyst and residual monomer were removed from the reaction mixture and the polymer was obtained as dry powder. GPC analysis was performed to determine the molecular weight of the polymer (Table P-21).

TABLE P-21

| Ex. | M8 | M14 | Pd-1206 | DANFABA | Tol. | EA | FA | Yield | $M_w$ | PDI |
|---|---|---|---|---|---|---|---|---|---|---|
| 21a | 48.7, 0.14 | 9.0, 0.06 | 0.12, 0.10 | 0.24, 0.30 | 97.8 | 32.4 | 30 | 70 | 5,530 | 2.67 |
| 21b | 60.9, 0.18 | 11.3, 0.08 | 0.15, 0.13 | 0.30, 0.38 | 122.2 | 40.7 | 30 | 89 | 5,540 | 1.59 |

Polymer Synthesis Example P-22 (A-B)

Polymerization of MM(MMHFP)$_2$NB (M10)

A reaction vessel was charged with MM(MMHFP)$_2$NB, toluene and ethyl acetate and sparged with nitrogen. This vessel was sealed and placed in a dry box. Solid Pd-1206 and DANFABA were added. The vessel was taken out of the dry box and a desired amount of formic acid, sparged with nitrogen, based on the mole percent of the monomer was added. The mixture was heated to 100° C. and stirred for 16 hours. Catalyst and monomer were removed from the reaction mixture and the polymer was obtained as a dry powder. GPC analysis of the polymer as a solution in tetrahydrofuran was performed to determine the molecular weight (Table P-22).

TABLE P-22

| Ex. | M10 | Pd-1206 | DANFABA | Tol. | EA | FA | Yield | $M_w$ | PDI |
|---|---|---|---|---|---|---|---|---|---|
| 22a | 4.06, 0.01 | 0.02, 0.01 | 0.03, 0.04 | 4.5 | 1.5 | 10 | 25 | 6,306 | 1.26 |
| 22b | 4.06, 0.01 | 0.02, 0.01 | 0.03, 0.01 | 4.4 | 1.5 | 20 | 25 | 5,139 | 1.23 |

Polymer Thin Film Characterization

Polymer Thin Film Behavior Example L-1

Thin Film Behavior of HFANB (M2) Homopolymers as Top-Coat Layers in Immersion Lithography The polymers indicated in table L-1 were spun on bare silicon wafers from a 20 wt % solution in isobutanol and baked at 90° C. for 2 minutes. Water contact angle (CA), water sliding angle (SA), measured in degrees in Tables L-1 to L-10, inclusive, and dissolution rate (DR) in aqueous alkali developer (0.26N TMAH) were determined. Results are in Table L-1.

TABLE L-1

| Ex. | Polymer Example | Mw | PDI | CA | SA | DR |
|---|---|---|---|---|---|---|
| L-1a | 1a | 21,919 | 2.45 | 74 | 23 | 175 nm/s |
| L-1b | 1b | 4,558 | 1.72 | 74 | 18 | 642 nm/s |
| L-1c | 1e | 3,660 | 1.66 | 79 | 16 | 758 nm/s |

Polymer Thin Film Behavior Example L-2

Thin Film Behavior of TFSNB (M1) Homopolymers as Top-Coat Layers in Immersion Lithography The polymers indicated in table L-2 were spun on bare silicon wafers from a 20 wt % solution in isobutanol and baked at 90° C. for 2 minutes. Water contact angle (CA), water sliding angle (SA) and dissolution rate (DR) in aqueous alkali developer (0.26N TMAH) were determined. Results are in Table L-2.

TABLE L-2

| Ex. | Polymer Example | Mw | PDI | CA | SA | DR |
| --- | --- | --- | --- | --- | --- | --- |
| L-2a | 2a | 16,824 | 2.40 | 73 | 20 | 1024 nm/s |
| L-2b | 2b | 2,860 | 1.43 | 78 | 22 | 1731 nm/s |
| L-2c | 2c | 2,121 | 1.31 | 80 | 22 | 2254 nm/s |

Polymer Thin Film Behavior Example L-3

Thin Film Behavior of TFSEtNB (M3) Homopolymers as Top-Coat Layers in Immersion Lithography The polymers indicated in table L-3 were spun on bare silicon wafers from a 20 wt % solution in isobutanol and baked at 90° C. for 2 minutes. Water contact angle (CA), water sliding angle (SA) and dissolution rate (DR) in aqueous alkali developer (0.26N TMAH) were determined. Results are in Table L-3,

TABLE L-3

| Ex. | Polymer Example | Mw | PDI | CA | SA | DR |
| --- | --- | --- | --- | --- | --- | --- |
| L-3 | 3 | 4,472 | 1.68 | 85 | 15 | 599 nm/s |

Polymer Thin Film Behavior Example L-4

Thin Film Behavior of MMHFPNB (M5) Homopolymers as Top-Coat Layers in Immersion Lithography The polymers indicated in table L-4 were spun on bare silicon wafers from a 20 wt % solution in isobutanol (20 wt % 4-methylpentan-2-ol for examples 6a, 6b and 6c) and baked at 90° C. for 2 minutes. Water contact angle (CA), water sliding angle (SA) and dissolution rate (DR) in aqueous alkali developer (0.26N TMAH) were determined. Results are in Table L-4.

TABLE L-4

| Ex. | Polymer Example | Mw | PDI | CA | SA | DR (nm/s) |
| --- | --- | --- | --- | --- | --- | --- |
| L-4a | 4a | 13,841 | 2.81 | 78 | 9 | 805 |
| L-4b | 4b | 5,247 | 1.89 | | | 1,546 |
| L-4c | 5a | 3,673 | 1.49 | | | 2,137 |
| L-4d | 5b | 3,545 | 1.46 | 80 | 10 | 2,025 |

Polymer Thin Film Behavior Example L-5

Thin Film Behavior of EMHFPNB (M6) Homopolymers as Top-Coat Layers in Immersion Lithography The polymers indicated in table L-5 were spun on bare silicon wafers from a 20 wt % solution in isobutanol (20 wt % 4-methylpentan-2-ol for examples 8a and 8b). Water contact angle (CA), water sliding angle (SA) and dissolution rate (DR) in aqueous alkali developer (0.26N TMAH) were determined. Results are in Table L-5.

TABLE L-5

| Ex | Polymer Example | Mw | PDI | CA | SA | DR (nm/s) |
| --- | --- | --- | --- | --- | --- | --- |
| L-5a | 6a | 28,656 | 3.61 | 80 | 5 | 234 |
| L-5b | 6b | 18,321 | 2.94 | 79 | 9 | 492 |
| L-5c | 6c | 11,106 | 2.63 | | | 523 |
| L-5d | 6d | 4,504 | 1.85 | | | 1,485 |
| L-5e | 6e | 3,391 | 1.54 | | | 1,749 |
| L-5f | 7a | 7,672 | 1.87 | | | 650 |
| L-5g | 7b | 7,645 | 1.91 | 80 | 5 | 690 |

Polymer Thin Film Behavior Example L-6

Thin Film Behavior of BMHFPNB (M7) Homopolymers as Top-Coat Layers in Immersion Lithography The polymers indicated in table L-6 were spun on bare silicon wafers from a 20 wt % solution in isobutanol (20 wt % 4-methylpentan-2-ol for example 10). Water contact angle (CA), water sliding angle (SA) and dissolution rate (DR) in aqueous alkali developer (0.26N TMAH) were determined. Results are in Table L-6.

TABLE L-6

| Ex | Polymer Example | Mw | PDI | CA | SA | DR (nm/s) |
| --- | --- | --- | --- | --- | --- | --- |
| L-6a | 8a | 33,872 | 3.75 | 79 | 5 | 160 |
| L-6b | 8b | 25,128 | 3.29 | 79 | 9 | 204 |
| L-6c | 8c | 19,699 | 2.34 | 77 | 4 | 190 |
| L-6d | 8d | 15,895 | 2.61 | 78 | 9 | 385 |
| L-6f | 9 | 21,470 | 2.59 | 80 | 6 | 164 |

Polymer Thin Film Behavior Example L-7

Thin Film Behavior of GlyMHFPNB (M8) Homopolymers as Top-Coat Layers in Immersion Lithography The polymers indicated in table L-8 were spun on bare silicon wafers from a 20 wt % solution in isobutanol (20 wt % 4-methylpentan-2-ol for examples 13a and 13b). Water contact angle (CA), water sliding angle (SA) and dissolution rate (DR) in aqueous alkali developer (0.26N TMAH) were determined. Results are in Table L-7,

TABLE L-7

| Ex | Polymer Example | Mw | PDI | CA | SA | DR (nm/s) |
|---|---|---|---|---|---|---|
| L-7a | 10a | 31,820 | 4.55 | 85 | 6 | 1,031 |
| L-7b | 10b | 16,011 | 3.27 | 86 | 5 | 1,176 |
| L-7c | 10c | 12,084 | 2.89 | 86 | 7 | 1,609 |
| L-7d | 11a | 9,950 | 2.32 | 86 | 4 | 1,755 |
| L-7e | 11b | 6,580 | 2.03 | 86 | 6 | 2,767 |

Polymer Thin Film Behavior Example L-8

Thin Film Behavior of MMHFPNB/FPCNB (M5/M4) Polymer as Top-Coat Layers in Immersion Lithography. (Batch Polymerization Method)

The polymers indicated in table L-9 were spun on bare silicon wafers from a 20 wt % solution in isobutanol. Water contact angle (CA), water sliding angle (SA) and dissolution rate (DR) in aqueous alkali developer (0.26N TMAH) were determined. Results are in Table L-8.

TABLE L-8

| Ex. | Polymer Example | M5/M4 Composition | Mw | PDI | CA | SA | DR (nm/s) |
|---|---|---|---|---|---|---|---|
| L-8a | 12a | 84/16 | 5,795 | 1.78 | 85 | 14 | 223 |
| L-8b | 12b | 74/26 | 4,775 | 1.63 | 86 | 13 | 39 |
| L-8c | 12c | 71/29 | 3,434 | 1.51 | 92 | 15 | 31 |

Polymer Thin Film Behavior Example L-9

Thin Film Behavior of EMHFPNB/FPCNB (M6/M4) Polymers as Top-Coat Layers in Immersion Lithography The polymers indicated in table L-10 were spun on bare silicon wafers from a 20 wt % solution in isobutanol. Water contact angle (CA), water sliding angle (SA) and dissolution rate (DR) in aqueous alkali developer (0.26N TMAH) were determined. Results are in Table L-9.

TABLE L-9

| Ex. | Polymer Example | M6/M4 Composition | Mw | PDI | CA | SA | DR |
|---|---|---|---|---|---|---|---|
| L-9a | 13a | 79/19 | 11,917 | 2.62 | 89 | 9 | 31 nm/s |
| L-9b | 13b | 74/26 | 8,551 | 2.24 | 88 | 8 | 7 nm/s |
| L-9c | 13c | 75/25 | 7,683 | 2.10 | 90 | 10 | 8 nm/s |

Polymer Thin Film Behavior Example L-10

Thin Film Behavior of GlyMHFPNB/FPCNB (M8/M4) Polymer as Top-Coat Layers in Immersion Lithography The polymers indicated in table L-11 were spun on bare silicon wafers from a 20 wt % solution in isobutanol (20 wt % 4-methylpentan-2-ol for example 16c). Water contact angle (CA), water sliding angle (SA) and dissolution rate (DR) in aqueous alkali developer (0.26N TMAH) were determined. Results are in Table L-10.

TABLE L-10

| Ex. | Polymer Example | M8/M4 Composition | Mw | PDI | CA | SA | DR (nm/s) |
|---|---|---|---|---|---|---|---|
| L-10a | 14a | 90/10 | 8,905 | 2.55 | 86 | | 947 |
| L-10b | 14b | 80/20 | 7,786 | 2.54 | 89 | | 599 |
| L-10c | 14c | 77/23 | 8,700 | 2.42 | 87 | 7 | 405 |

Polymer Thin Film Behavior Example L-11

Thin Film Behavior of Homopolymers as Top-Coat Layers in Immersion Lithography

The polymers indicated in table L-10 were spun on bare silicon wafers from a 20 wt % solution in 4-methylpentan-2-ol. Optical densities (OD) of thin films were determined. Results are in Table L-11.

TABLE L-11

| Ex. | Polymer Example | Polymer | Mw | PDI | OD ($\mu m^{-1}$) |
|---|---|---|---|---|---|
| L-11a | ** | pMMHFPNB | 5,750 | 1.94 | 0.042 |
| L-11b | ** | pEMHFPNB | 7,570 | 1.85 | 0.052 |
| L-11c | ** | pBMHFPNB | 21,470 | 2.59 | 0.032 |
| L-11d | 11-b | pGlyMHFPNB | 6,580 | 1.94 | 0.109 |
| L-11e | 11-a | pGlyMHFPNB | 9,950 | 2.32 | 0.081 |

** the homopolymers measured were made in accordance with the exemplary procedures provided herein.

Polymer Thin Film Behavior Example L-12

Thin Film Behavior of MMHFPNB/FPCNB (M5/M4) Polymer as Top-Coat Layers in Immersion Lithography. (Semi-Batch Polymerization Method)

The polymers indicated in table L-12 were spun on bare silicon wafers from a 20 wt % solution in 4-methylpentan-2-ol. Water contact angle (CA), water sliding angle (SA) and dissolution rate (DR) in aqueous alkali developer (0.26N TMAH) were determined. Results are in Table L-12.

TABLE L-12

| Ex. | Polymer Example | (M5/M4) Composition | Mw | PDI | CA | SA | DR nm/s |
|---|---|---|---|---|---|---|---|
| 12 | 15 | 81/19 | 4,710 | 1.49 | 83 | 6 | 169 |

Polymer Thin Film Behavior Example L-13

Thin Film Behavior of GlyMHFPNB/NBC$_4$F$_9$ (M8/M13) Polymer as Top-Coat Layers in Immersion Lithography The polymers indicated in table L-13 were spun on bare silicon wafers from a 20 wt % solution in 4-methylpentan-2-ol. Water contact angle (CA), water sliding angle (SA) and dissolution rate (DR) in aqueous alkali developer (0.26N TMAH) were determined. Results are in Table L-13.

TABLE L-13

| Ex. | Polymer Example | (M8/M13) Composition | Mw | PDI | CA | SA | DR nm/s |
|---|---|---|---|---|---|---|---|
| L-13a | 16a | 85/15 | 2,831 | 1.23 | 86 | 9 | 1,589 |
| L-13b | 16b | 80/20 | 3,218 | 1.25 | 88 | 14 | 1,277 |
| L-13c | 16c | 75/25 | 2,902 | 1.25 | 92 | 18 | 350 |

Polymer Thin Film Behavior Example L-14

Thin Film Behavior of GlyMHFPNB/FHCNB (M8/M11) Polymer as Top-Coat Layers in Immersion Lithography The polymers indicated in table L-14 were spun on bare silicon wafers from a 20 wt % solution in 4-methylpentan-2-ol. Water contact angle (CA), water sliding angle (SA) and dissolution rate (DR) in aqueous alkali developer (0.26N TMAH) were determined. Results are in Table L-14.

TABLE L-14

| Ex. | Polymer Example | (M8/M11) Composition | Mw | PDI | CA | SA | DR nm/s |
|---|---|---|---|---|---|---|---|
| L-14a | 17a | 88/12 | 7,790 | 2.02 | 88 | 12 | 348 |
| L-14b | 17b | 85/15 | 7,330 | 1.94 | 91 | 12 | 259 |
| L-14c | 17c | 82/18 | 6,920 | 1.86 | 93 | 14 | 142 |

Polymer Thin Film Behavior Example L-15

Thin Film Behavior of GlyMHFPNB/FOHCNB (M8/M12) Polymer as Top-Coat Layers in Immersion Lithography The polymers indicated in table L-15 were spun on bare silicon wafers from a 20 wt % solution in 4-methylpentan-2-ol. Water contact angle (CA), water sliding angle (SA) and dissolution rate (DR) in aqueous alkali developer (0.26N TMAH) were determined. Results are in Table L-15.

TABLE L-15

| Ex. | Polymer Example | (M8/M12) Composition | Mw | PDI | CA | SA | DR nm/s |
|---|---|---|---|---|---|---|---|
| L-15a | 18a | 89/11 | 12,070 | 2.71 | 87 | 5 | 383 |
| L-15b | 18b | 86/14 | 7,980 | 2.14 | 85 | 9 | 399 |
| L-15c | 18c | 81/19 | 7,300 | 2.01 | 86 | 10 | 263 |

Polymer Thin Film Behavior Example L-16

Thin Film Behavior of MM(MMHFP)2NB/FHCNB (M10/M11) Polymer as Top-Coat Layers in Immersion Lithography The polymers indicated in table L-16 were spun on bare silicon wafers from a 20 wt % solution in isobutanol. Water contact angle (CA) and water sliding angle (SA) were determined. Results are in Table L-16.

TABLE L-16

| Ex. | Polymer Example | (M10/M11) Composition | Mw | PDI | CA | SA |
|---|---|---|---|---|---|---|
| L-16a | 19 | 72/28 | 5,334 | 1.23 | 89 | 23 |

Polymer Thin Film Behavior Example L-17

Thin Film Behavior of MMHFPNB/NBC$_4$F$_9$ (M5/M13) Polymer as Top-Coat Layers in Immersion Lithography The polymers indicated in table L-17 were spun on bare silicon wafers from a 20 wt % solution in 4-methylpentan-2-ol. Water contact angle (CA), water sliding angle (SA) and dissolution rate (DR) in aqueous alkali developer (0.26N TMAH) were determined. Results are in Table L-17.

TABLE L-17

| Ex. | Polymer Example | (M5/M13) Composition | Mw | PDI | CA | SA | DR nm/s |
|---|---|---|---|---|---|---|---|
| L-17a | 20a | 85/15 | 1,933 | 1.11 | 85 | 6 | 935 |
| L-17b | 20b | 76/24 | 2,079 | 1.18 | 90 | 10 | 163 |

Polymer Thin Film Behavior Example L-18

Thin Film Behavior of GlyMHFPNB/BuNB (M8/M14) Polymer as Top-Coat Layers in Immersion Lithography The polymers indicated in table L-17 were spun on bare silicon wafers from a 20 wt % solution in 4-methylpentan-2-ol. Water contact angle (CA), water sliding angle (SA) and dissolution rate (DR) in aqueous alkali developer (0.26N TMAH) were determined. Results are in Table L-18

TABLE L-18

| Ex. | Polymer Example | (M8/M14) Composition | Mw | PDI | CA | SA | DR nm/s |
|---|---|---|---|---|---|---|---|
| L-18a | 21a | 85/15 | 5,530 | 1.67 | 86 | 9 | 1,058 |
| L-18b | 21b | 79/21 | 5,540 | 1.59 | 86 | 5 | 567 |

Polymer Thin Film Behavior Example L-19

Thin Film Behavior of MM(MMHFP)$_2$NB (M10) Homopolymers as Top-Coat Layers in Immersion Lithography The polymers indicated in table L-16 were spun on bare silicon wafers from a 20M % solution in isobutanol. Water contact angle (CA), water sliding angle (SA) and dissolution rate (DR) in aqueous alkali developer (0.26N TMAH) were determined. Results are in Table L-19.

TABLE L-19

| Ex. | Polymer Example | Mw | PDI | CA | SA | DR nm/s |
|---|---|---|---|---|---|---|
| L-19a | 22a | 6,306 | 1.26 | 81 | 17 | 1,061 |
| L-19b | 22b | 5,139 | 1.23 | 81 | 19 | — |

While it has been known that the inclusion of alkyl spacers generally provide an increase in hydrophobicity (as measured by CA/SA), such an increase has generally been at the expense of aqueous base solubility (as measured by DR). For example, comparing the data provided in Tables L-2 and L-3, above, it can be seen the increase to an ethyl spacer from a methyl spacer in TSFNB analogs results in an increase in hydrophobicity while DR decreases dramatically.

While such an effect might be expected for any of the aforementioned spacer moieties, it has been unexpectedly found that the inclusion of ether or glycol spacers both increase hydrophobicity and aqueous base solubility. For example, Table L-1 shows that the HFANB homopolymer 1a has a DR of 175 nm/sec while the ether spaced MMHFPNB homopolymer 4a (Table L-4) has a DR of 805 nm/sec. With regard to hydrophobicity, 1a has CA and SA values of 74 and 23 degrees, while the CA and SA values for 4a are 78 and 9 degrees. Further Table L-7 shows that the glycol spaced analog of homopolymer 1a shows similar increases in hydrophobicity and aqueous base solubility. Specifically, homopolymer 7a (GlyMHFPNB) was found to have a CA of 86 degrees, a SA of 5 degrees and a DR of 1176 nm/sec.

With regard to polymer embodiments in accordance with the present disclosure, it has been unexpectedly found that the inclusion of repeating units with fluorinated pendant groups increase hydrophobicity with only slight effects on DR. More specifically, repeating units with carboxylated fluorinated pendent groups increase hydrophobicity dramatically. For example, Table L-18 shows the polymer GlyMHFPNB and non-fluorinated BuNB 18a has a DR of 1,058, Table L-13 shows the polymer GlyMHFPNB and fluorinated $NBC_4F_9$ has a DR of 1589, Table L-17 shows the polymer MMHFPNB and fluorinated $NBC_4F_9$ 17a has a DR of 935, while Table L-15 shows the polymer of MMHFPNB and carboxylated fluorinated FOHCNB 15a has a DR of 383. With regard to hydrophobicity, 18a has CA and SA values of 86 and 9, 13a has CA and SA values of 86 and 9, and 17a has CA and SA values of 85 and 6, while the CA and SA values for 15a are 87 and 5.

With regard to the batch and semi-batch polymerization methods, it has been found that the semi-batch method increases hydrophobicity. For examples, Table L-8 shows the polymer MMHFPNB and FPCNB 8a (batch method) has CA and SA values of 85 and 14, while Table L-12 shows the same polymer (semi-batch method) has CA and SA values of 83 and 6.

By now it should be realized that the non-self, imageable norbornene-type polymers that have been described are useful for immersion lithographic processes, for forming top-coat layers for overlying photoresist layers in immersion lithographic processes, methods of making such polymers, compositions employing such polymers and immersion lithographic processes that make use of such compositions.

What is claimed is:

1. A top-coat composition comprising a non-self imageable polymer consisting of norbornene-type repeating units represented by formula I:

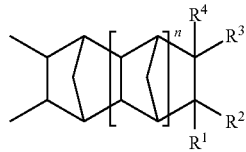

(I)

wherein n is an integer from 0 to 5 inclusive;

at least one of $R^1$, $R^2$, $R^3$ and $R^4$ independently represents one of the groups represented by formulae A, B and C:

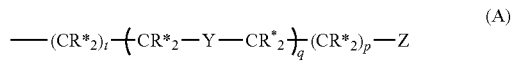

(A)

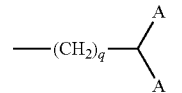

(B)

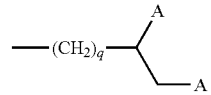

(C)

where Z is represented by a group of formula D:

(D)

t is an integer from 0 to 5; p is an integer from 0 to 3; each q is independently an integer from 1 to 3; R* independently represents a hydrogen, a methyl group or an ethyl group; and each A of formulae B and C is a group represented by formula A as defined above; and where $R^f$ independently is $C_nQ_{2n+1}$, where Q independently represents F or H;

remaining $R^1$, $R^2$, $R^3$ and $R^4$ independently represents hydrogen, a linear or branched alkyl group, a linear or branched haloalkyl group; and a casting solvent.

2. The top-coat composition of claim 1, further comprising at least one additional norbornene-type repeating unit distinct from said first norbornene-type repeating unit of formula (I).

3. The top-coat composition of claim 1, wherein said non-self imageable polymer is having a molecular weight ($M_w$) of from 2,000 to 80,000.

4. The top-coat composition of claim 1, wherein said non-self imageable polymer is having a molecular weight ($M_w$) of from 2000 to 30000.

5. The top-coat composition of claim 1, wherein said non-self imageable polymer is derived from one or more norbornene-type monomers selected from:

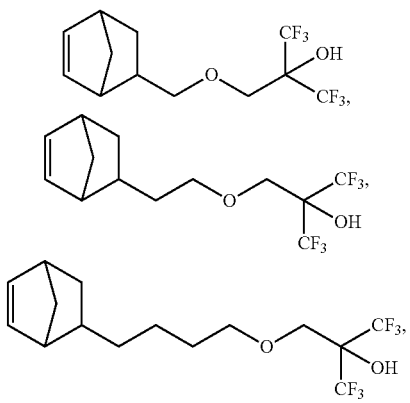

-continued

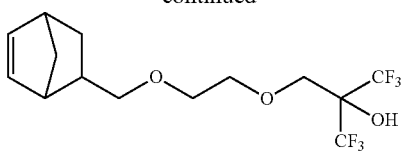

and

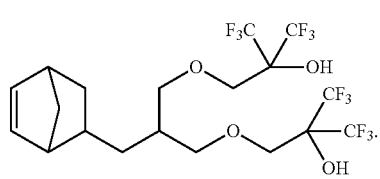

6. The top-coat composition of claim 1, wherein said non-self imageable polymer is derived from a norbornene-type monomer of the formula:

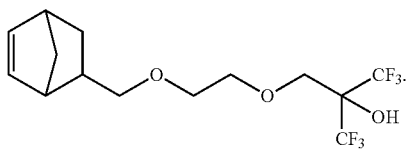

7. The top-coat composition of claim 2, wherein said additional norbornene-type repeating unit is derived from a monomer selected from:

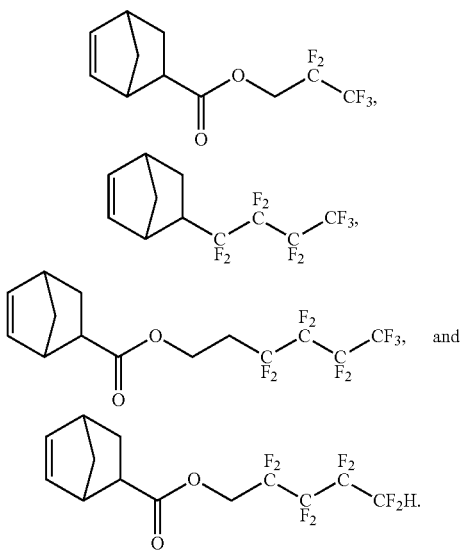

8. The top-coat composition of claim 1, wherein said non-self imageable polymer is a homopolymer derived from a norbornene-type monomer of the formula:

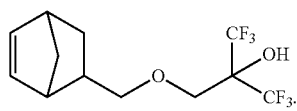 [SMILES: OC(COCC1CC2C=CC1C2)(C(F)(F)F)C(F)(F)F]

9. The top-coat composition of claim 1, wherein said non-self imageable polymer is a homopolymer derived from a norbornene-type monomer of the formula:

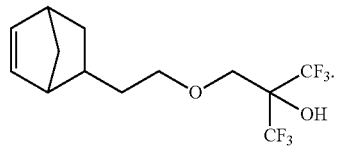 [SMILES: OC(COCCC1CC2C=CC1C2)(C(F)(F)F)C(F)(F)F]

10. The top-coat composition of claim 1, wherein said non-self imageable polymer is a homopolymer derived from a norbornene-type monomer of the formula:

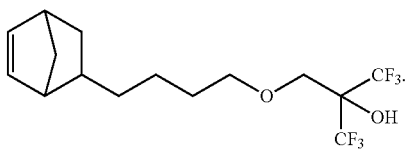

11. The top-coat composition of claim 1, wherein said non-self imageable polymer is a homopolymer derived from a norbornene-type monomer of the formula:

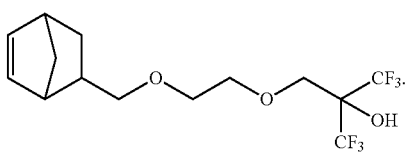 [SMILES: OC(COCCOCC1CC2C=CC1C2)(C(F)(F)F)C(F)(F)F]

12. The top-coat composition of claim 1, wherein said non-self imageable polymer is a homopolymer derived from a norbornene-type monomer of the formula:

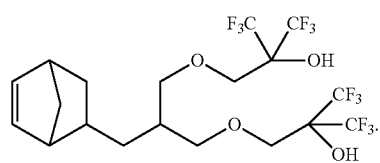 [SMILES: OC(COCC(COCC(O)(C(F)(F)F)C(F)(F)F)CC1CC2C=CC1C2)(C(F)(F)F)C(F)(F)F]

13. The top-coat composition of claim 1, further comprising one or more of an acidic moiety or a surfactant.

14. The top-coat composition of claim 1, where the solvent is selected from n-butyl alcohol, isobutyl alcohol, n-pentanol, 4-methyl-2-pentanol, 2-octanol, 2-perfluorobutyl ethanol ($C_4F_9CH_2CH_2OH$), perfluoropropyl methanol ((($C_3F_7$)$CH_2OH$)), $H(CF_2)_2CH_2$—O—$(CF_2)_2$—H, $H(CF_2)_7$—(CO)O—$CH_3$, and $H(CF_2)_4$—(CO)O—$C_2H_5$, diisopropylether, diisobutylether, dipentylether, methyl-t-butylether and mixtures thereof.

15. An immersion lithographic method comprising:
first forming a photoresist layer overlying an active surface of a substrate;
second forming a top-coat layer overlying the photoresist layer where said top-coat layer is formed using the top-coat composition of claim 1;
imagewise exposing the photoresist layer; and
developing the imagewise exposed photoresist layer with an aqueous alkali developer solution, where such developing removes the top-coat layer and forms a patterned photoresist layer.

16. The method of claim 15, where prior to the second forming, the substrate is first heated to a first temperature for a first period of time.

17. The method of claim 16, where after the second forming, the substrate is second heated to a second temperature for a second period of time.

18. The method of claim 17, where before the developing, the substrate is third heated to a third temperature for a third period of time.

19. The method of claim 18, where the first, second and third temperatures are the same or different in the range of from 70° C. to 140° C. and the first, second and third periods of time are the same or different in the range of from 40 to 180 seconds.

20. The method of any of claim 19, where the aqueous alkali developer solution is a 0.26N aqueous solution of tetramethylammonium hydroxide (TMAH).

* * * * *